(12) United States Patent
Kajigaya

(10) Patent No.: US 7,948,784 B2
(45) Date of Patent: May 24, 2011

(54) SEMICONDUCTOR MEMORY DEVICE HAVING VERTICAL TRANSISTORS

(75) Inventor: Kazuhiko Kajigaya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 455 days.

(21) Appl. No.: 12/230,235

(22) Filed: Aug. 26, 2008

(65) Prior Publication Data

US 2009/0059644 A1   Mar. 5, 2009

(30) Foreign Application Priority Data

Aug. 29, 2007   (JP) ................. 2007-223206

(51) Int. Cl.
G11C 5/02 (2006.01)
G11C 5/06 (2006.01)
G11C 11/401 (2006.01)
G11C 11/40 (2006.01)

(52) U.S. Cl. ............ 365/51; 365/148; 365/149; 365/63; 365/72

(58) Field of Classification Search ............. 365/51, 365/63, 72, 148, 149
See application file for complete search history.

(56) References Cited

U.S. PATENT DOCUMENTS 5,072,425 A * 12/1991 Kohno et al. ............... 365/226
5,831,912 A * 11/1998 Mueller et al. ............. 365/190
6,208,547 B1 * 3/2001 Ooishi ........................ 365/51
6,954,371 B2   10/2005 Hokari et al.
7,145,792 B2   12/2006 Hokari et al.
2005/0024949 A1   2/2005 Hokari et al.
2005/0281110 A1   12/2005 Hokari et al.

FOREIGN PATENT DOCUMENTS

| JP | 7-122654 | 5/1995 |
| JP | 2001-14861 | 1/2001 |
| JP | 2003-332532 | 11/2003 |
| JP | 2005-51044 | 2/2005 |

* cited by examiner

*Primary Examiner* — J. H. Hur
(74) *Attorney, Agent, or Firm* — McGinn IP Law Group, PLLC

(57) ABSTRACT

A semiconductor memory device includes a memory cell array region in which vertical transistors each having a lower electrode connected to a bit line is regularly arranged with a predetermined pitch, including memory cells formed using at least the vertical transistors; a peripheral circuit region arranged adjacent to the memory cell array region in a bit line extending direction; and a predetermined circuit arranged overlapping the peripheral circuit region and the memory cell array region. In the semiconductor memory device, the vertical transistors each having an upper electrode connected to the predetermined circuit are included in an end region of the memory cell array region, in which no word line is provided.

10 Claims, 22 Drawing Sheets

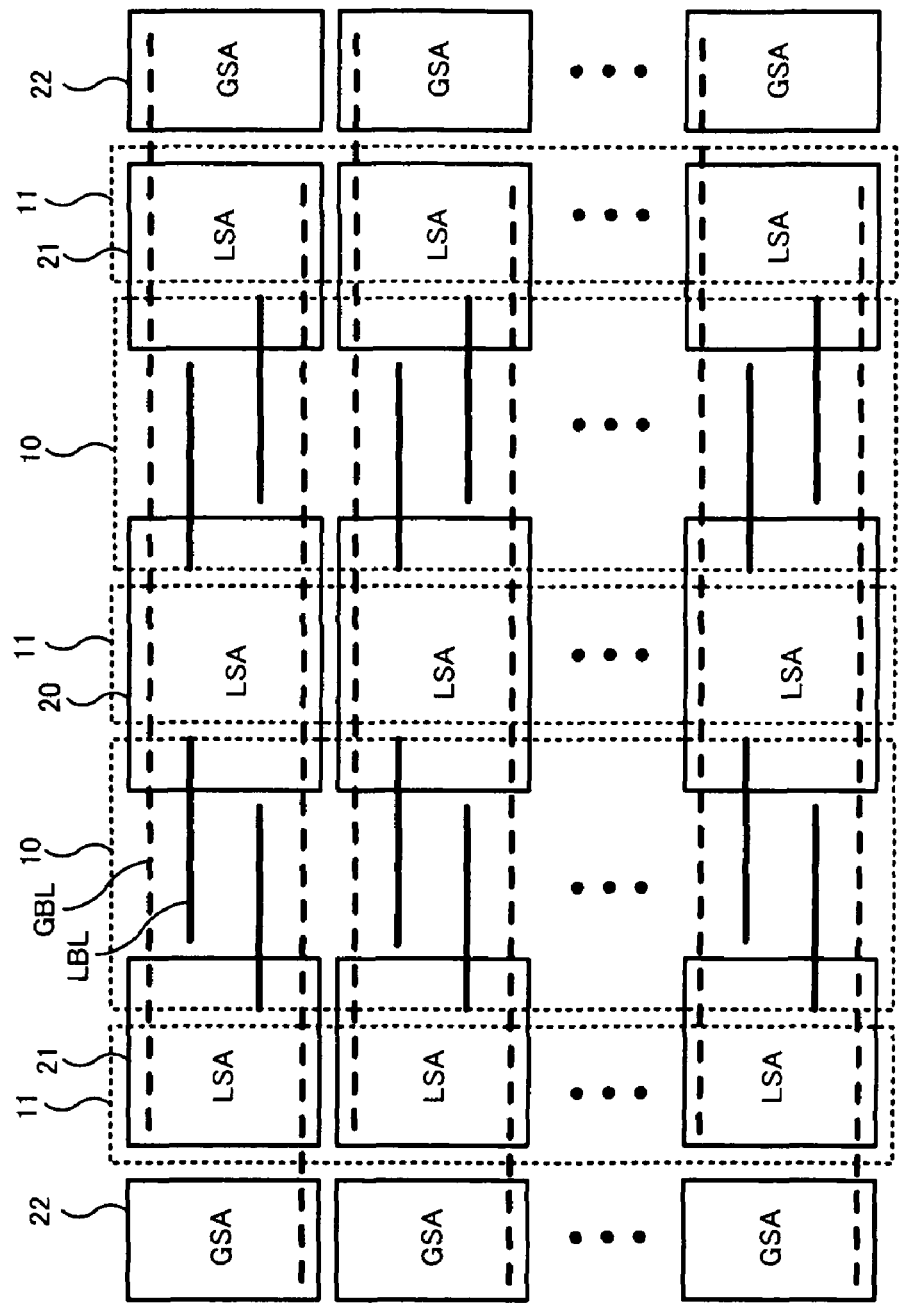

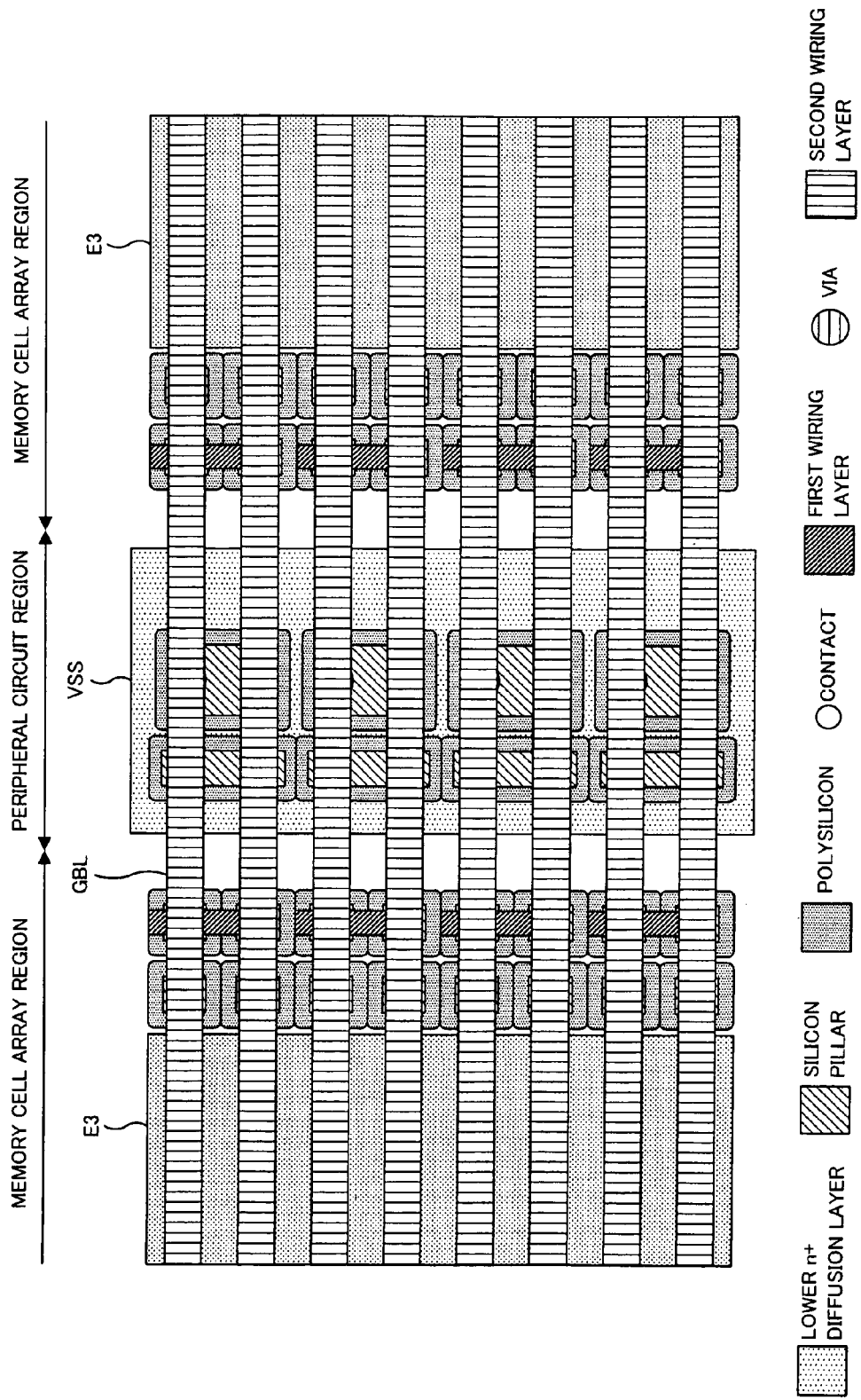

SEMICONDUCTOR MEMORY DEVICE HAVING VERTICAL TRANSISTORS

BACKGROUND OF THE INVENTION

1. Field of the Invention

The present invention relates to a semiconductor memory device which rewritably stores data in a plurality of memory cells formed at intersections of a plurality of word lines and a plurality of bit lines, and particularly relates to a semiconductor memory device employing an embedded bit line structure in which a bit line is arranged below a vertical transistor formed at each memory cell.

2. Description of Related Art

In order to reduce the chip area of a semiconductor memory device such as SRAM or DRAM, it is important to reduce an occupied area of a peripheral circuit disposed adjacent to a memory cell array, as well as to reduce an area of the memory cell array itself. Therefore, various layout methods for reducing the occupied area of the peripheral circuit such as sense amplifiers in the semiconductor memory device have been proposed (see Patent References 1 to 4). Also, in connection with these layout methods, methods have been proposed in which transistors regularly arranged in the memory cell array are used as constituent elements of other circuits whose purpose is different from that of each memory cell, The Patent Reference 1 discloses a technique for improving connection reliability in a large capacity DRAM having memory cells of a COB (Capacitor Over Bit Line) structure without providing a buffering area for a step between the memory cell array and the peripheral circuit. According to the technique in the Patent Reference 1, a method for employed in which MOS transistors included in the peripheral circuit are formed with the same layout and the same structure as a select transistor of the memory cell.

The Patent Reference 2 discloses a semiconductor memory device capable of reducing the area in an arrangement with small sense amplifiers between a plurality of memory cell arrays of SRAM without providing dummy memory cells. According to the technique in the Patent Reference 2, the small sense amplifiers can be configured by directly utilizing the transistor arrangement of the memory cells.

The Patent Reference 3 discloses a semiconductor memory device in which a capacitor of a memory cell of DRAM is used as a decoupling capacitor for a power supply wiring so as to reduce an area where other decoupling capacitors are formed. According to the technique in the Patent Reference 3, memory cells existing in a part of the memory cell array are connected in parallel, and the decoupling capacitor is achieved by controlling a select transistor to be constantly on.

The Patent Reference 4 discloses a technique of providing dummy cells in the memory cell array and using them in a read operation. According to the technique in the Patent Reference 4, the dummy cells are formed using capacitors having the same structure as of a normal cell, and a layout for the normal cell can be utilized only by providing an additional write MOS transistor for controlling.

Patent Reference 1: Laid-open Japanese Patent Publication No. Hei7-122654
Patent Reference 2: Laid-open Japanese Patent Publication No. 2001-14861
Patent Reference 3: Laid-open Japanese Patent Publication No. 2003-332532
Patent Reference 4: Laid-open Japanese Patent Publication No. 2005-51044

In order to miniaturize the memory cell of the DRAM, it is desirable to form the memory cell for which a vertical transistor structure is employed as the select transistor. Generally, in the memory cell formed in this manner, an embedded bit line structure is employed in which a capacitor is formed above the vertical transistor and a bit line is arranged below the vertical transistor. Further, in the peripheral circuit of the DRAM, particularly an area occupied by sense amplifiers arranged adjacent to the memory cell array is dominant. However, on the premise of the memory cell array employing the vertical transistor structure and the peripheral circuit including a sense amplifier circuit and the like in the DRAM, it is difficult to apply any of the above-mentioned conventional techniques.

Since the technique disclosed in the Patent Reference 1 is assumed to be applicable to a memory cell using a planer type MOS transistor, it is not applicable to the vertical transistor structure. The technique disclosed in the Patent Reference 2 is applicable only to the memory cell array of SRAM, and thus is not applicable to the memory cell array of DRAM. The technique disclosed in the Patent Reference 3 is not applicable to a transistor included in the sense amplifier. The technique disclosed in the Patent Reference 4 is applicable only to the dummy cell, and is not applicable to a transistor included in the sense amplifier. In this manner, according to the above conventional techniques, a problem exists in that the purpose of reducing the chip area cannot be achieved by using the vertical transistor for the memory cell of DRAM and by applying it to the transistor included in the sense amplifier.

SUMMARY

The present invention seeks to solve the above problem and provides a semiconductor memory device in which a vertical transistor structure is employed as a select transistor of a memory cell so as to form a memory cell array, and part of vertical transistors are utilized as elements of a peripheral circuit in order to reduce a chip area.

In one of aspects of the invention, there is provided a semiconductor memory device having a plurality of memory cells arranged at intersections of a plurality of word lines and a plurality of bit lines intersecting therewith, which comprises: a memory cell array region in which a plurality of vertical transistors each having a lower electrode connected to each bit line is regularly arranged with a predetermined pitch, the memory cell array region including the plurality of memory cells formed using at least the vertical transistors; a peripheral circuit region arranged adjacent to the memory cell array region in a bit line extending direction; and a predetermined circuit arranged overlapping the peripheral circuit region and the memory cell array region. In this semiconductor memory device, one or more of the vertical transistors each having an upper electrode connected to the predetermined circuit are included in an end region of the memory cell array region, in which no word line is provided.

According to the aspects of the invention, in the memory cell array region, the plurality of memory cells each formed using the vertical transistor is arranged at intersections of the word lines and the bit lines. Meanwhile, the vertical transistors in the end region in which no word line is provided are connected to the predetermined circuit arranged overlapping the memory cell array region and the peripheral circuit region. When the predetermined circuit is formed only in the peripheral circuit region, the transistor size increases and the arrangement becomes irregular, and therefore an increase in the area is inevitable. On the other hand, the present invention enables that part of the predetermined circuit is formed by utilizing the vertical transistors which can be arranged in a small size and with high density in the same manner as the memory cell array. Thus, the occupied area of the predetermined circuit can be reliably reduced, and a semiconductor memory device with a small chip area can be achieved.

As described above, according to the present invention, when a memory cell array is formed by arranging memory cells of an embedded bit line structure including vertical transistors, one or more vertical transistors included in an end region close to a peripheral circuit of the memory cell array can be utilized as elements of the peripheral circuit. In comparison with a case in which a peripheral circuit such as sense amplifiers and the like are arranged only in the peripheral circuit region, the vertical transistors with a small size can be arranged with high density and with the same pitch as the memory cells, thereby reducing an entire chip area.

Further, each of the above vertical transistors has a structure where the bit line is connected to a lower electrode. For example, contacts for connecting transistors of the peripheral circuit and the bit lines are not required to be formed. Therefore, the manufacturing process is correspondingly simplified, and it is effective for reducing manufacturing cost.

Furthermore, since the vertical transistors in the end region close to the peripheral circuit region are utilized as elements of the peripheral circuit, it is possible to eliminate or reduce dummy transistors, which are normally provided in the end region for the purpose of improving accuracy of lithography, so that the chip area can be reduced.

BRIEF DESCRIPTION OF THE DRAWINGS

The above featured and advantages of the present invention will be more apparent from the following description of certain preferred embodiments taken in conjunction with the accompanying drawings, in which:

FIG. 2 is a diagram showing an entire configuration of DRAM of the first embodiment;

FIG. 11 is a diagram showing layout pattern in which a second wiring layer is formed above the vias of FIG. 10 in the layout of DRAM of the first embodiment;

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes. In the following, two embodiments whose hierarchy structures and circuit configurations are different from each other will be described.

First Embodiment

Figure 1A:
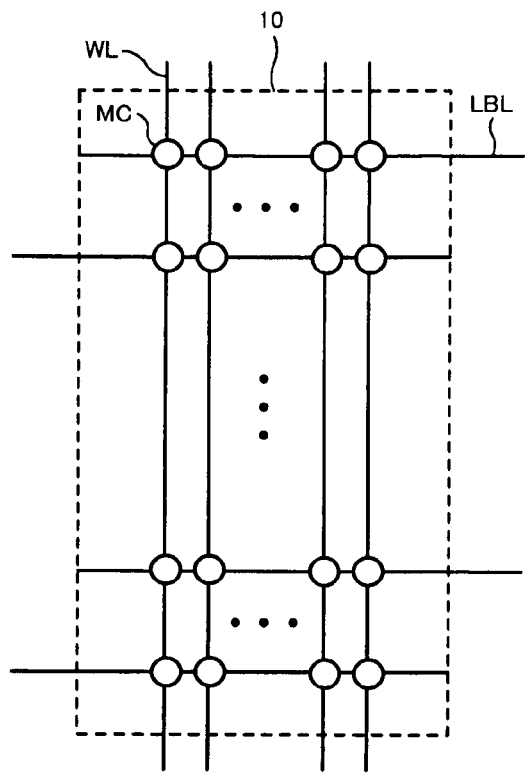
FIGS. 1A and 1B are block diagrams showing a configuration of the memory cell array of a first embodiment.

A first embodiment of the present invention will be described. In the first embodiment, the present invention is applied to DRAM as a semiconductor memory device, and a memory cell array is configured in which the vertical MOS transistor is employed as a select transistor of each memory cell. A configuration of the memory cell array of the first embodiment will be described with reference to FIG. 1A. As shown in FIG. 1A, in the memory cell array of the first embodiment, a plurality of word lines WL and a plurality of local bit lines LBL intersecting therewith are arranged in a memory cell array region 10, and there are provided a large number of memory cells MC (indicated by white circles) formed at intersections of the lines. For example, when M local bit lines LBL and N word lines WL are arranged in the memory cell array region 10, M×N memory cells MC are arranged in total so that the memory cell array having a storage capacity of M×N bits can be configured. Besides, the vertical transistor is also arranged in an end region in the memory cell array region 10, where no word line WL is arranged, details of which will be described later.

Figure 1B:
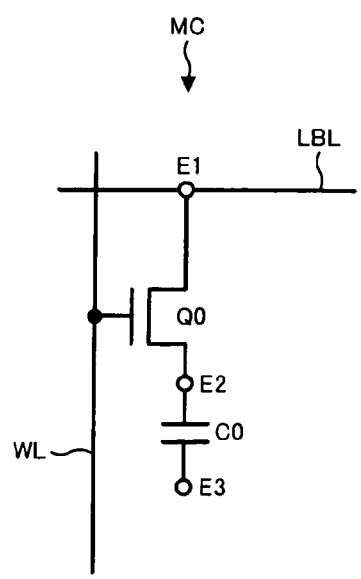

Each memory cell MC in the memory cell array is a 1T1C type memory cell (configured with one transistor and one capacitor), as shown in FIG. 1B. A select transistor Q0 of the memory cell MC is a vertical MOS transistor formed using a silicon pillar, and a capacitor C0 is disposed thereabove (lower side in the figure). In the select transistor Q0, a lower source/drain electrode E1 below a lower end of the silicon pillar (upper side in the figure) is connected to a lower local bit line LBL, an upper source/drain electrode E2 above an upper end of the silicon pillar is connected to an accumulation electrode of the capacitor C0, and a gate electrode is connected to a word line WL. Further, an opposite electrode of the capacitor C0 is connected to a common electrode E3.

An entire configuration of DRAM of the first embodiment will be described with reference to FIG. 2. In FIG. 2, an inside area of a DRAM chip is partitioned into memory cell array regions 10 and peripheral circuit regions 11, which are alternately arranged and adjacent in a bit line extending direction. The memory cell array of FIG. 1 is configured in each memory cell array region 10. Also, a plurality of local sense amplifiers (LSA) 20 and 21 attached to the memory cell arrays are arranged in each peripheral circuit region 11, and the local sense amplifiers 20 and 21 are partially arranged overlapping the end region of the memory cell array region 10.

Common type local sense amplifiers 20 arranged at the center of FIG. 2 are shared by memory cell arrays on both sides, to each of which two local bit lines LBL in the memory cell arrays on both sides are selectively connected. Further, each of the local sense amplifiers 21 arranged at both ends in FIG. 2 is attached to only one adjacent memory cell array, and corresponding one local bit line LBL is connected thereto. Each of the local sense amplifiers 20 and 21 reads and amplifies a signal of the memory cell MC transmitted through the local bit line LBL. In addition, the local bit lines LBL arranged in the memory cell array are alternately connected to the left side local sense amplifiers 20, 21 and the right side local sense amplifiers 20, 21

Meanwhile, the global bit line arranged overlapping two memory cell arrays in parallel with the above local bit lines LBL of each memory cell array is connected to each of a plurality of the global sense amplifiers (GSA) 22 arranged at both ends in the configuration of FIG. 2. Each global sense amplifier 22 reads the signal amplified by the local sense amplifier 20 or 21 through the global bit line GBL, and amplifies and holds the signal. A general amplifier circuit (not shown) is configured as the global sense amplifier 22, and data is inputted/outputted from/to outside through input/output lines (not shown). In addition, the plurality of global bit lines GBL are alternately connected to the global sense amplifiers 22 on the left and right sides.

In this manner, the memory cell array having the above-described hierarchy structure is configured in the first embodiment. In the example of FIG. 2, since the local bit lines LBL can be selectively connected to one global bit line GBL, the number of memory cells of the local bit line LBL can be reduced. In FIG. 2, the example partitioned into two memory cell array regions 10 and three peripheral circuit regions 11 is shown, however the partition is not limited thereto and the configuration may be partitioned into more memory cell array regions 10 and more peripheral circuit regions 11. For example, when the configuration is partitioned into L memory cell array regions 10, L−1 peripheral circuit regions 11 and two peripheral circuit regions 11 at both ends can be arranged. In this case, L local bit lines LBL can be selectively connected to one global bit line GBL, and the number of memory cells of the local bit line LBL can be further reduced by increasing L.

Figure 3:
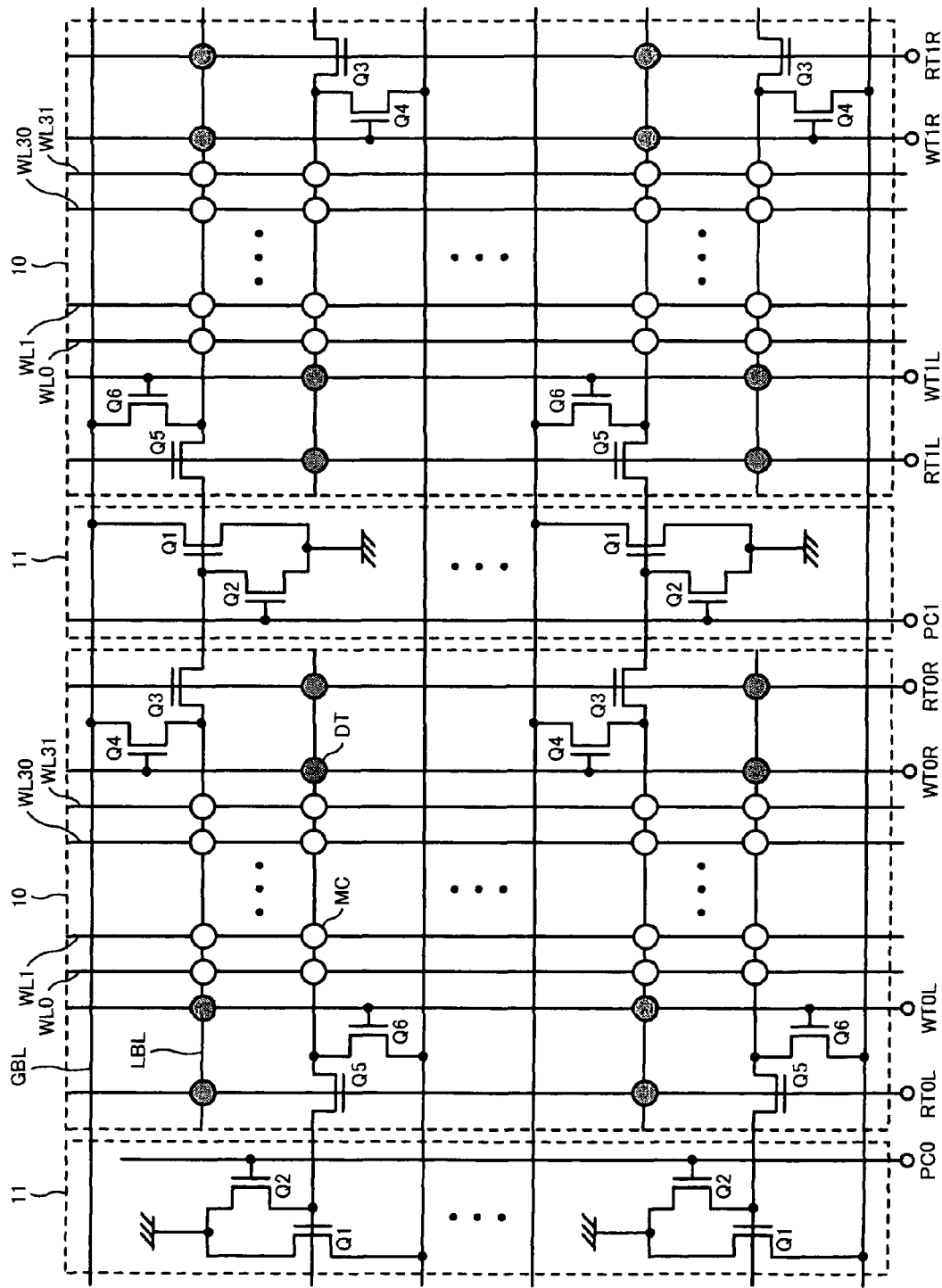
FIG. 3 is a diagram showing a specific circuit configuration of a memory cell array region and a peripheral circuit region in FIG. 2.

Next, a specific circuit configuration and operation of the memory cell array regions 10 and the peripheral circuit regions 11 in FIG. 2 will be described with reference to FIG. 3. In FIG. 3, attention is paid to a unit circuit of an area including adjacent two global bit lines GBL and corresponding two local bit lines LBL in FIG. 2, and the circuit configuration of the unit circuit is shown. When M local bit lines LBL are arranged in each memory cell array, M/2 unit circuits each including one local sense amplifier 20 and two local sense amplifiers 21 at both ends are arranged repeatedly, however FIG. 3 shows only the circuit configuration of the unit circuits at both ends. In FIG. 3, the peripheral circuit region 11 at right end and the global sense amplifiers 22 at both ends are omitted.

In FIG. 3, each local sense amplifier 20 at the center (FIG. 2) includes MOS transistors Q1 and Q2 provided in the peripheral circuit region 11, MOS transistors Q3 and Q4 provided in the end region of the memory cell array region 10 adjacent on the left side, and MOS transistors Q5 and Q6 provided in the end region of the memory cell array region 10 adjacent on the right side. Here, all the MOS transistors Q1 to Q6 are N-channel type MOS transistors.

The MOS transistor Q1 is connected between the global bit line GBL and ground, and its gate is connected to the local bit line LBL via the MOS transistor Q3 or Q5. The MOS transistor Q2 is connected between the gate of the MOS transistor Q1 (local bit line LBL) and ground, and a precharge signal PC1 is applied to its gate. In an amplification operation of the local sense amplifier 20, a signal of an arbitrary memory cell MC which is read out to the local bit line LBL is amplified by the MOS transistor Q1, and an inverted signal thereof is outputted to the global bit line GBL. Further, in a precharge operation of the local sense amplifier 20, the local bit line LBL is precharged to a ground level via the MOS transistor Q2 by receiving the precharge signal PC1 controlled to be high.

The MOS transistor Q3 in the left side memory cell array region 10 is inserted in series in each local bit line LBL, and a control signal RT0R is applied to its gate. The MOS transistor Q5 in the right side memory cell array region 10 is inserted in series in each local bit line LBL, and a control signal RT1L is applied to its gate. When the memory cell MC to be read in the local sense amplifier 20 belongs to the left side memory cell array region 10, the control signal RT0R is controlled to be high while the control signal RT1L is controlled to be low. On the other hand, when the memory cell MC to be read in the local sense amplifier 20 belongs to the right side memory cell array region 10, the control signal RT0R is controlled to be low while the control signal RT1L is controlled to be high. In this manner, one of two local bit lines LBL on both sides can be selectively connected to the MOS transistor Q1.

The MOS transistor Q4 in the left side memory cell array region 10 is connected between the global bit line GBL and the local bit line LBL, and a control signal WT0R is applied to its gate. The MOS transistor Q6 in the right side memory cell array region 10 is connected between the global bit line GBL and the local bit line LBL, and a control signal WT1L is applied to its gate. When the control signal WT0R is controlled to be high, data is written to a predetermined memory cell MC from the global bit line GBL through the local bit line LBL of the left side memory cell array region 10. On the other hand, when the control signal WT1L is controlled to be high, data is written to a predetermined memory cell MC from the global bit line GBL through the local bit line LBL of the right side memory cell array region 10.

The memory cell MC are arranged in the center region of the memory cell array region 10 in the same manner as in FIG. 1, and the MOS transistors Q3, Q4, Q5 and Q6 of the local sense amplifier 20 are arranged in the end region of the memory cell array region 10. In the first embodiment, these MOS transistors Q3 to Q6 are formed using vertical MOS transistors having the same arrangement and the same shape as the select transistor Q0 of the memory cell MC. On the other hand, the MOS transistors Q1 and Q2 in the peripheral circuit region 11 are formed with a size larger than the select transistor Q0 since they require driving ability.

Further, dummy transistors DT are arranged (indicated by black circles) at positions where the MOS transistors Q3 to Q6 are not formed in the end region of the memory cell array region 10. These dummy transistors DT are formed with vertical transistors in the same manner as the select transistor Q0, however, are not used in an actual operation. As shown in FIG. 3, the MOS transistors Q3 to Q6 and the dummy transistors DT are arranged in a regular manner in accordance with the arrangement of the memory cells MC, thereby effectively improving accuracy of lithography.

Meanwhile, each local sense amplifier 21 (FIG. 2) on the left side in FIG. 3 includes the MOS transistors Q1 and Q2 provided in the peripheral circuit region 11, and the MOS transistors Q5 and Q6 provided in the end region of the adjacent memory cell array region 10. Further, each local sense amplifier 21 on the right side (not shown) includes the MOS transistors Q1 and Q2 provided in the peripheral circuit region 11, and the MOS transistors Q3 and Q4 provided in the end region of the adjacent memory cell array region 10. In this manner, a pair of MOS transistors Q3 and Q4 or a pair of MOS transistors Q5 and Q6, both of which are included in the local sense amplifier 20 at the center, is attached to each of the local sense amplifiers 21 on both sides.

Next, a layout of DRAM of the first embodiment will be described with reference to FIGS. 4 to 11. In the following, layout patterns will be shown in the order of process from the lower layer side within a partial area of one peripheral circuit region 11 and two memory cell array regions 10 on both sides thereof.

Figure 4:
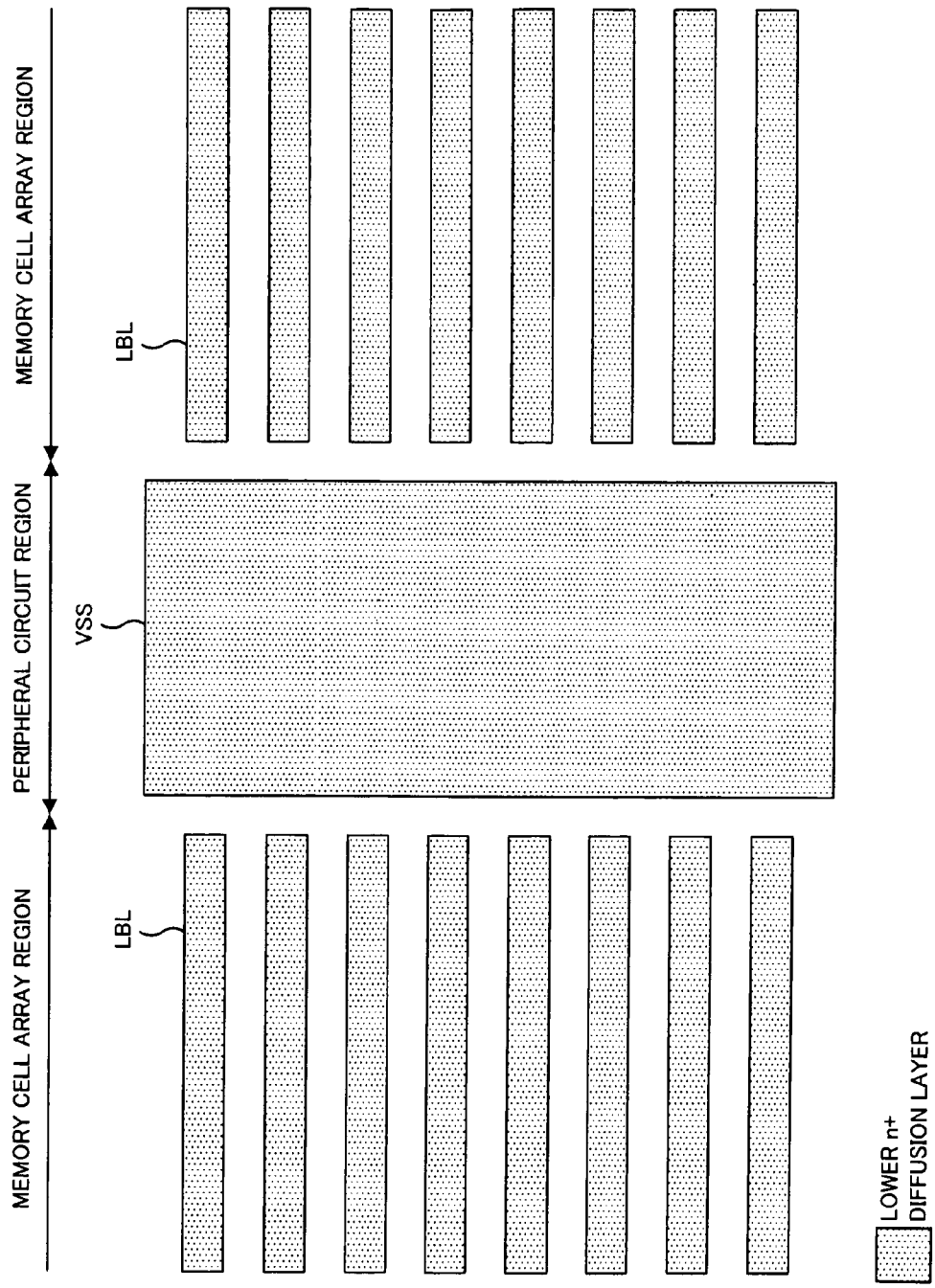
FIG. 4 is a diagram showing a layout pattern of a lower n+ diffusion layer in a layout of DRAM of the first embodiment.

FIG. 4 shows a layout pattern of a lower n+ diffusion layer formed using n-type impurity below the vertical select transistor Q0. In each of the memory cell array regions 10 on both sides, the lower n+ diffusion layer of a stripe pattern forms a pattern of the plurality of local bit lines LBL. In the peripheral circuit region 11 at the center, the lower n+ diffusion layer of a rectangular shape forms a pattern of a ground potential VSS. The ground potential VSS is coupled to sources of the MOS transistors Q1 and Q2 of FIG. 3. Note that only eight local bit lines LBL are shown in FIG. 4 for the simplicity, which will be the same in FIGS. 5 to 11.

Figure 5:
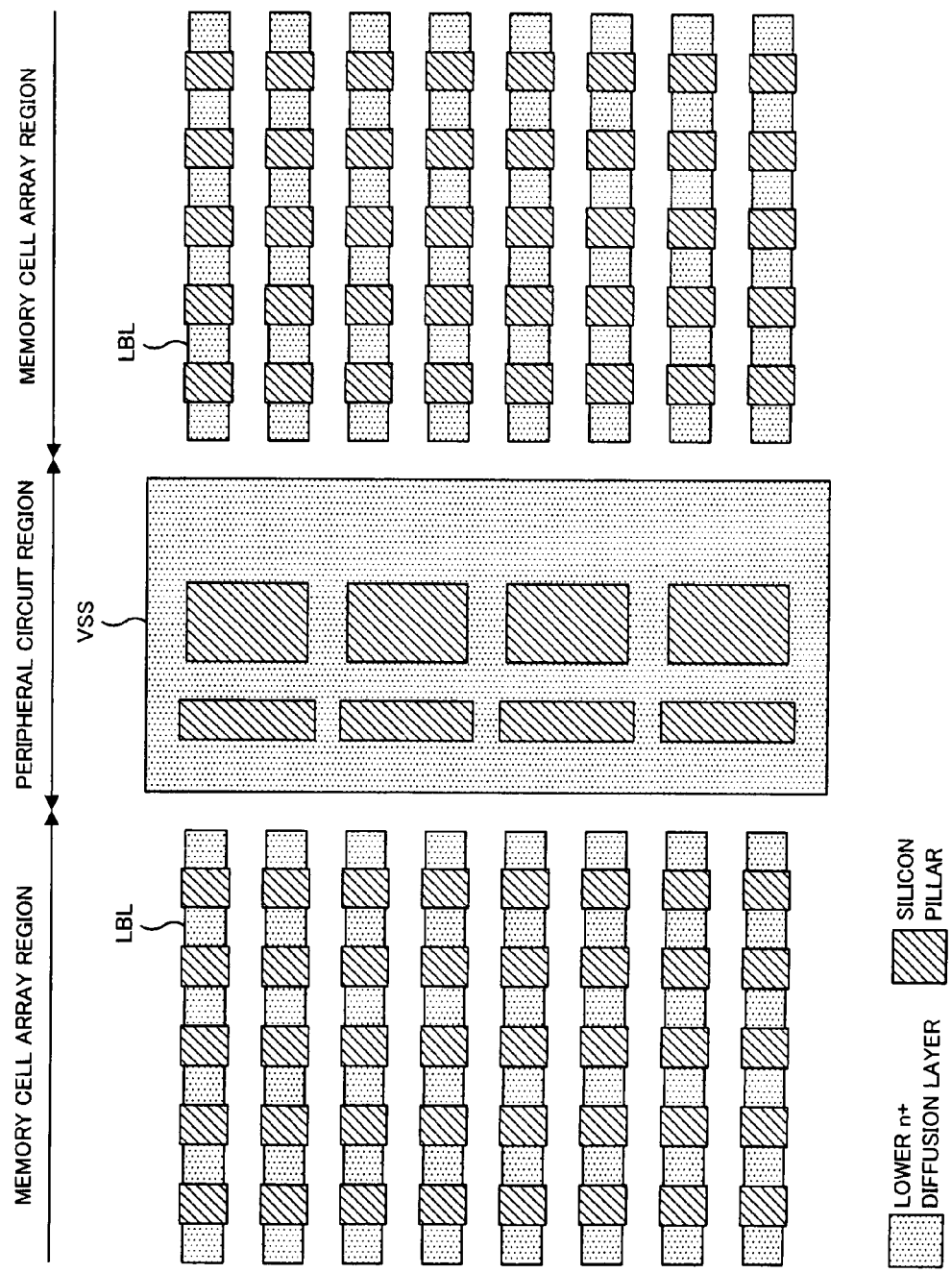
FIG. 5 is a diagram showing a layout pattern in which many silicon pillars are formed above the lower n+ diffusion layer in the layout of DRAM of the first embodiment.

FIG. 5 shows a layout pattern in which many silicon pillars are formed above the lower n+ diffusion layer of FIG. 4. In the memory cell array regions 10 on both sides, a plurality of silicon pillars is formed regularly with a predetermined pitch along the local bit lines LBL. These silicon pillars are arranged corresponding to the memory cells MC, the MOS transistors Q3 to Q6 and the dummy transistors DT of FIG. 3. Meanwhile, silicon pillars having larger sizes are formed in the peripheral circuit region 11 at the center corresponding to the MOS transistors Q1 and Q2.

Figure 6:
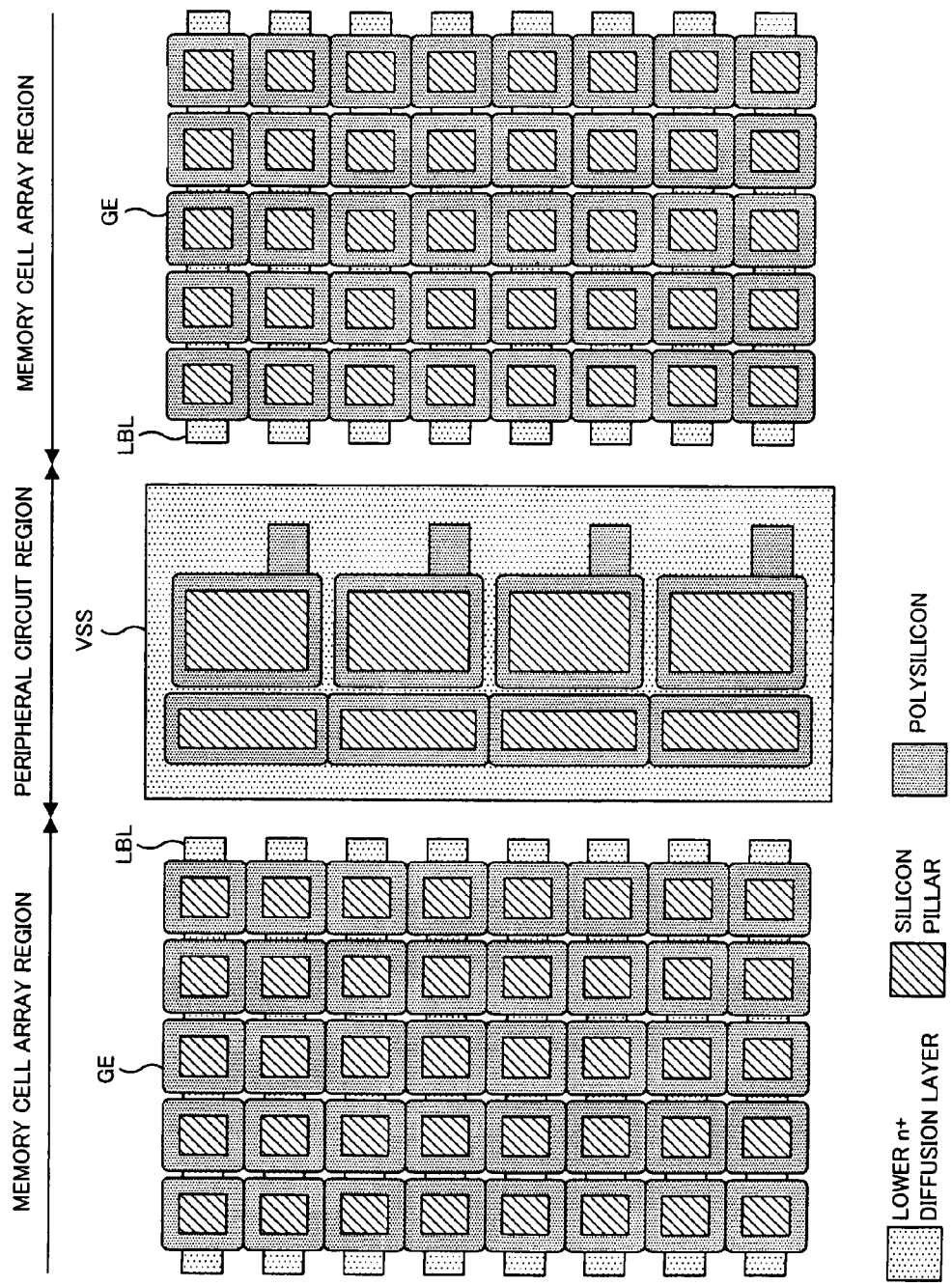
FIG. 6 is a diagram showing a layout pattern in which polysilicon is formed around each silicon pillar in the layout of DRAM of the first embodiment.

FIG. 6 shows a layout pattern in which polysilicon is formed around each silicon pillar of FIG. 5. The polysilicon is used as the gate electrode GE of the vertical MOS transistor. As shown in FIG. 6, the polysilicon is formed continuously along the extending direction of the word lines WL so as to form wirings. There are arranged a wiring of the control signal RT0R or RT1L, a wiring of the control signal WT0R or WT1L, word lines WL31, WL30 and WL29 (or WL0, WL1 and WL2) in this order from a row near the peripheral circuit region 11 at the center. Meanwhile, the polysilicon formed around the MOS transistor Q1 and around the MOS transistor Q2 is used as each gate electrode GE in the peripheral circuit region 11 at the center. The gate electrode GE of the transistor Q2 forms a wiring of the precharge signal PC1.

Figure 7:
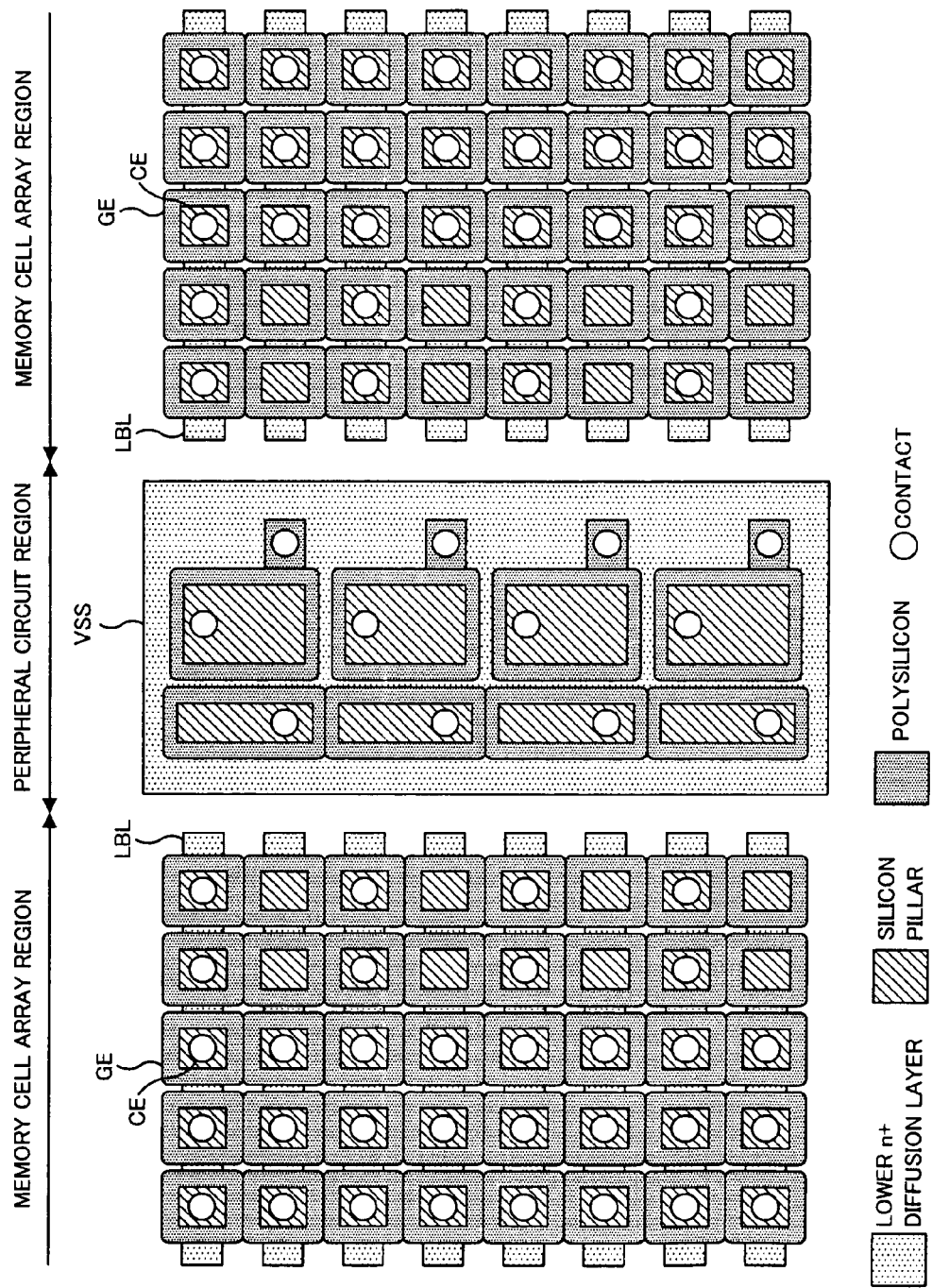
FIG. 7 is a diagram showing layout pattern in which contacts are formed over respective vertical MOS transistors in the layout of DRAM of the first embodiment.

FIG. 7 shows a layout pattern in which contacts are formed over the respective vertical MOS transistors. In the memory cell array regions 10 on both sides, the contacts are formed at positions of the upper source/drain electrodes E2 (FIG. 1B) of the select transistors Q0 and the MOS transistors Q3 to Q6, and are used as the contact electrodes CE. Here, no contact is formed at positions of the dummy transistors DT. In the peripheral circuit region 11 at the center, the contacts are formed at positions of source/drain electrodes of the MOS transistors Q1, Q2 and the gate electrodes GE of the MOS transistors Q1, and are used as the contact electrodes CE.

Figure 8:
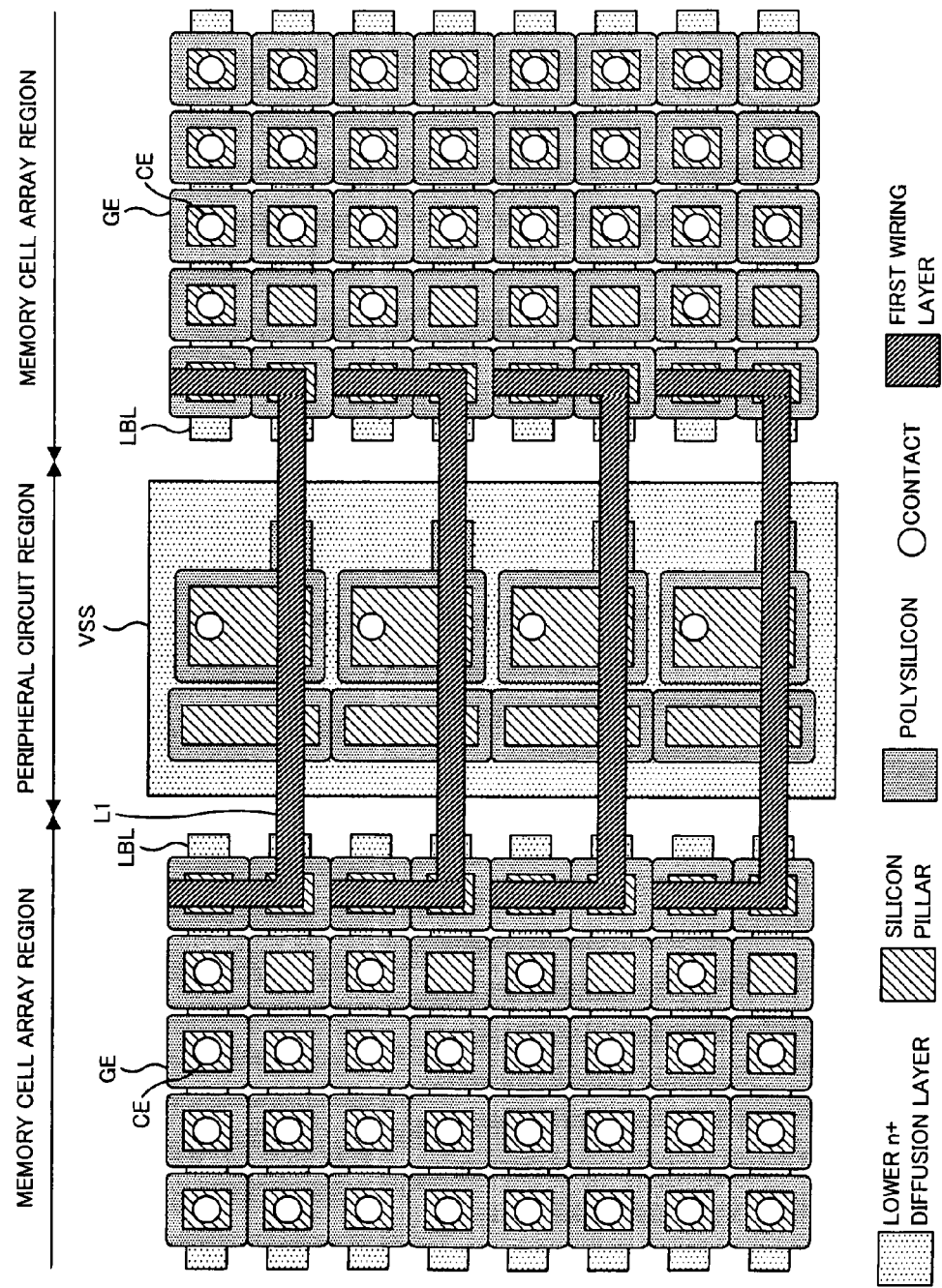
FIG. 8 is a diagram showing layout pattern in which a first wiring layer is formed above the pattern of FIG. 7 in the layout of DRAM of the first embodiment.

FIG. 8 shows a layout pattern in which a first wiring layer is formed above the pattern of FIG. 7. In the first wiring layer, there are formed wrings L1 contacting upper portions of the contact electrodes CE of the MOS transistors Q1, Q2 and the contact electrodes CE of the MOS transistors Q3, Q5. Each wiring L1 corresponds to a portion of the local bit line LBL connected to gates of the MOS transistor Q1 of FIG. 3.

Figure 9:
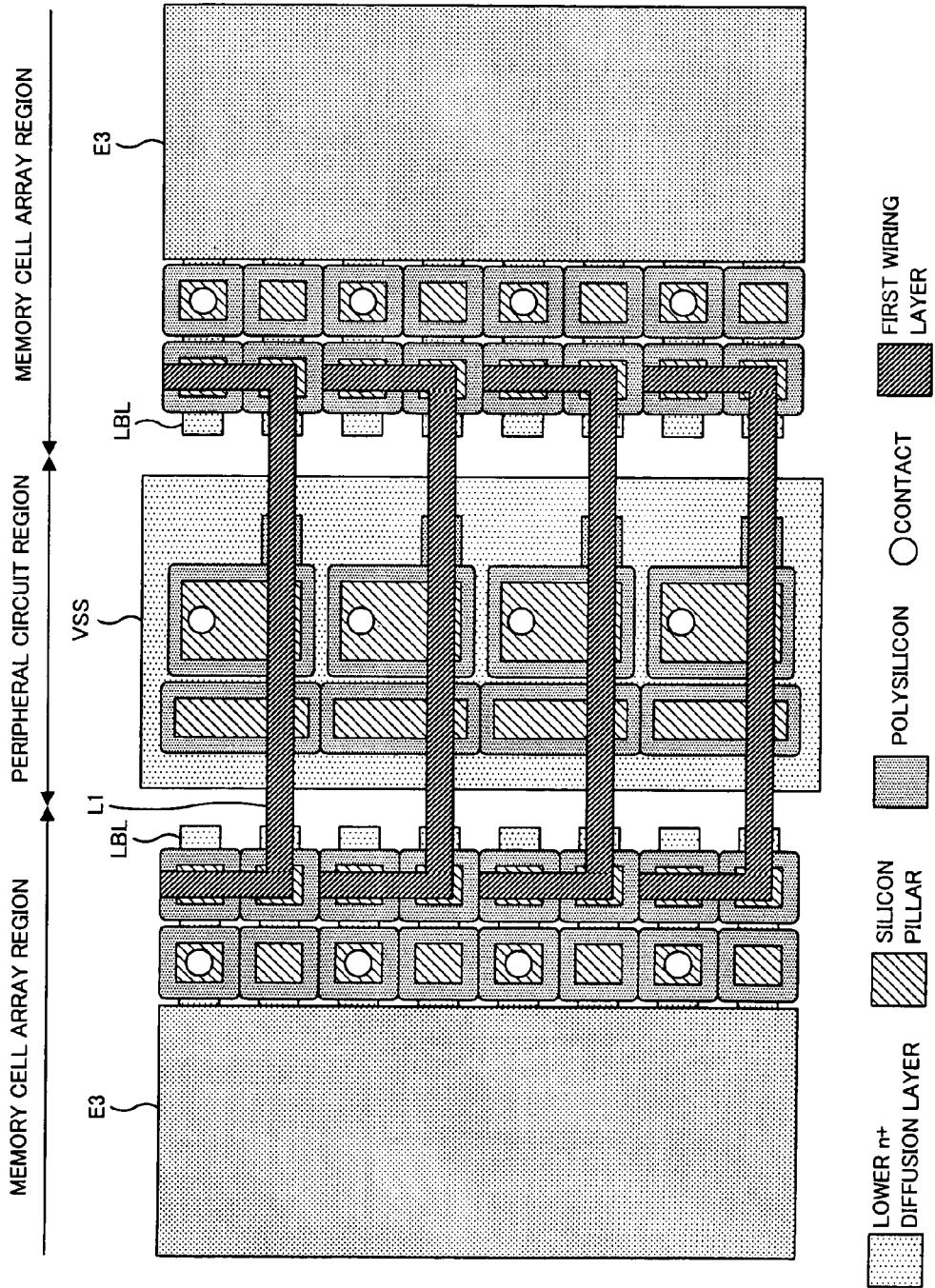
FIG. 9 is a diagram showing layout pattern in which common electrodes E3 of capacitors C0 formed above memory cells MC via a dielectric film in the layout of DRAM of the first embodiment.

FIG. 9 shows a layout pattern in which the common electrodes E3 (FIG. 1B) of the capacitors C0 formed above the memory cells MC via a dielectric film. Here, the common electrodes E3 are not formed in the end region of the memory cell array region 10 in which the memory cells MC are not arranged.

Figure 10:
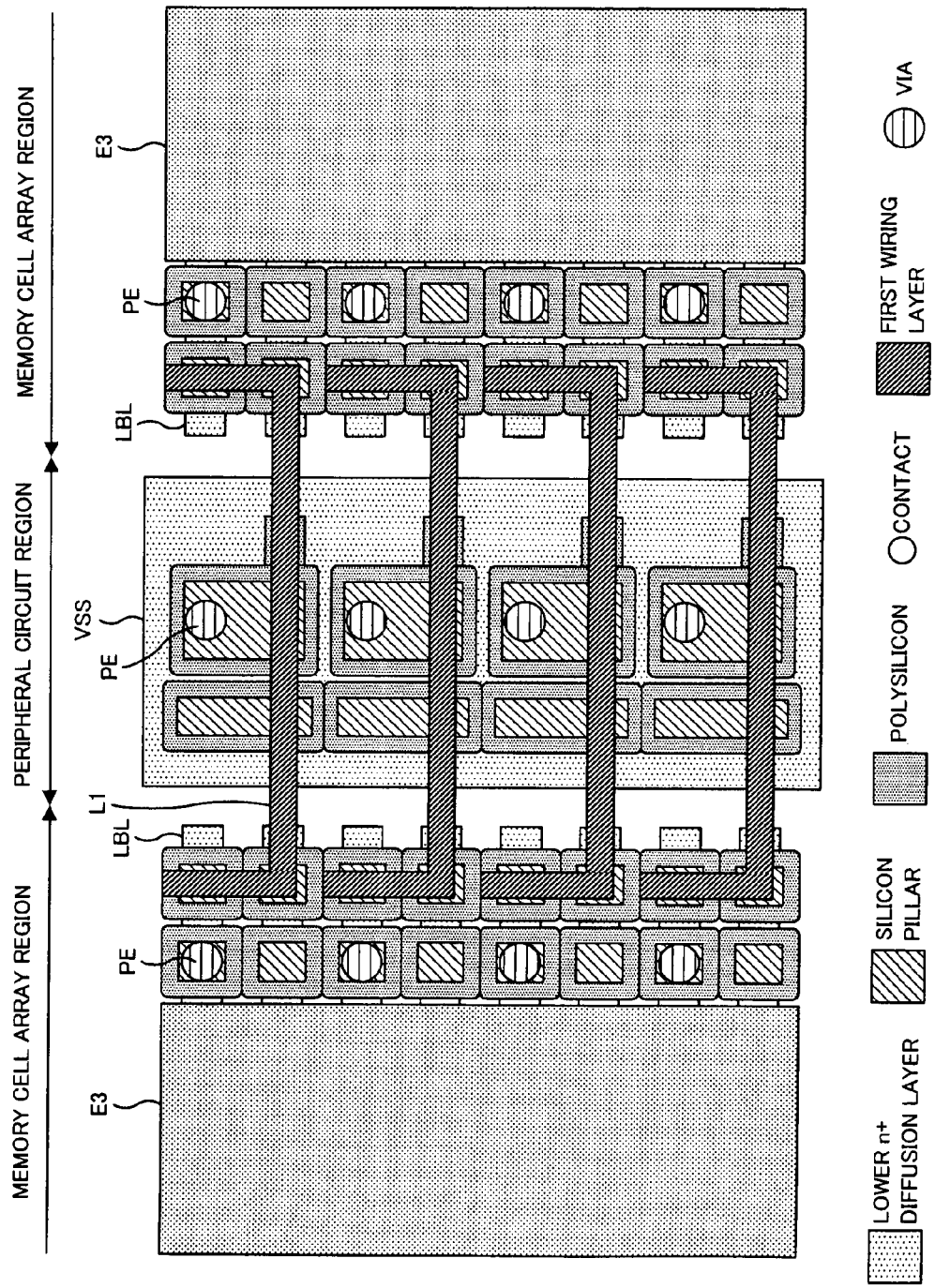
FIG. 10 is a diagram showing layout pattern in which vias are formed over contact electrodes CE in the layout of DRAM of the first embodiment.

FIG. 10 shows a layout pattern in which vias are formed over the contact electrodes CE. The vias are formed at positions of the MOS transistors Q4, Q6 of the memory cell array regions 10 on both sides and formed at positions of the MOS transistors Q1 of the peripheral circuit region 11 at the center, and plug electrodes PE are embedded therein. Thus, each source of the MOS transistors Q4, Q6 and each drain of the MOS transistors Q1 are connected to the plug electrode PE through the contact electrode CE.

FIG. 11 shows a layout pattern in which a second wiring layer is formed above the vias of FIG. 10. In the second wiring layer, there are formed a plurality of the global bit lines GBL of a stripe pattern which are arranged in parallel and overlapped with the memory cell array region 10 and the peripheral circuit region 11. Each global bit line GBL contacts an upper portion of each plug electrode PE. There are arranged 32 word lines WL0 to WL31 in the memory cell array region 10, and the memory cells are formed at all intersections of the local bit lines LBL and the word lines WL.

As described above, by employing the layout shown in FIGS. 4 to 11, only MOS transistors Q1 and Q2 can be arranged in the peripheral circuit region 11 and other MOS transistors Q3 to Q6 can be arranged in the end region of the memory cell array region 10, in the local sense amplifier 20. According to the first embodiment, the size of the MOS transistors Q3 to Q6 can be sufficiently small relative to a case where they are arranged in the peripheral circuit region 11, since it is the same size as the memory cell MC. Thus, the entire chip area can be reduced. Further, since only the contacts (FIG. 7) and the wirings L1 (FIG. 8) are required to be formed when connecting the MOS transistors Q3 to Q6 to the MOS transistors Q1 and Q2 of the peripheral circuit region 11, complicated process is not required and manufacturing cost can be reduced.

Figure 12A:
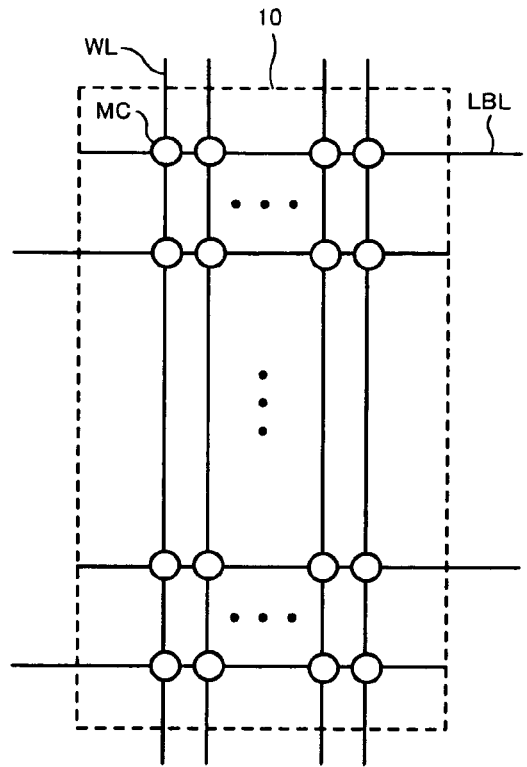
FIGS. 12A and 12B are diagrams explaining a modification of the first embodiment, in which the present invention is applied to a PRAM as a semiconductor memory device.

Hereinafter, a modification of the first embodiment will be described with reference to FIGS. 12A and 12B. In the above description, the present invention is applied to the DRAM as the semiconductor memory device, however the present invention will be applied to a PRAM (Phase-Change Random Access Memory) as a nonvolatile semiconductor memory device in the modification. As shown in FIG. 12A, a memory cell array of the modification is configured in the same manner as in FIG. 1A. Meanwhile, FIG. 12B shows a circuit configuration of a memory cell MC for the PRAM, which is formed at an intersection of a word line WL and a local bit lines LBL in the memory cell array.

Figure 12B:
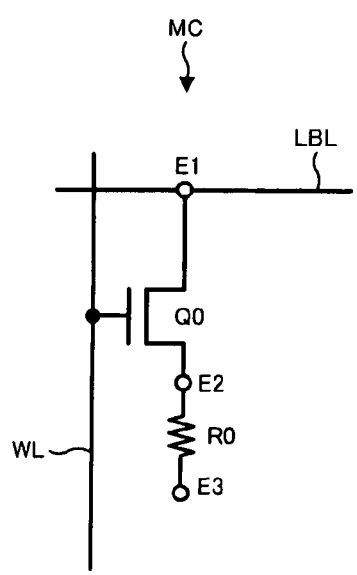

In FIG. 12B, the memory cell MC of the modification is a 1T1R type memory cell (configured with one transistor and one resistance element). The select transistor Q0 of the memory cell MC is the vertical MOS transistor as in FIG. 1, and a variable resistor element RD is disposed above the select transistor Q0. In the select transistor Q0, the lower source/drain electrode E1 is connected to the lower local bit line LBL, the upper source/drain electrode E2 is connected to an electrode at one end of the variable resistor element R0, and a gate electrode is connected to the word line WL. Further, an electrode at the other end of the variable resistor element R0 is connected to the common electrode E3. By heating the variable resistor element R0, the resistance state thereof is changed in two ways and information can be rewritably stored in each memory cell MC.

In the case of employing the above modification, the configuration based on FIGS. 2 to 11 is almost common. In addition, a phase change layer functioning as the variable resistor element R0 is formed below the common electrode E3 in FIG. 9.

Second Embodiment

Next, a second embodiment of the present invention will be described. The second embodiment is the same as the first embodiment in that the present invention is applied to DRAM as the semiconductor memory device and that the vertical MOS transistor is employed as the select transistor of the memory cell, however the hierarchy structure of the memory cell array differs from that of the first embodiment. Here, the configuration of the memory cell array of FIG. 1 is also common to the second embodiment, so description thereof will be omitted.

Figure 13:
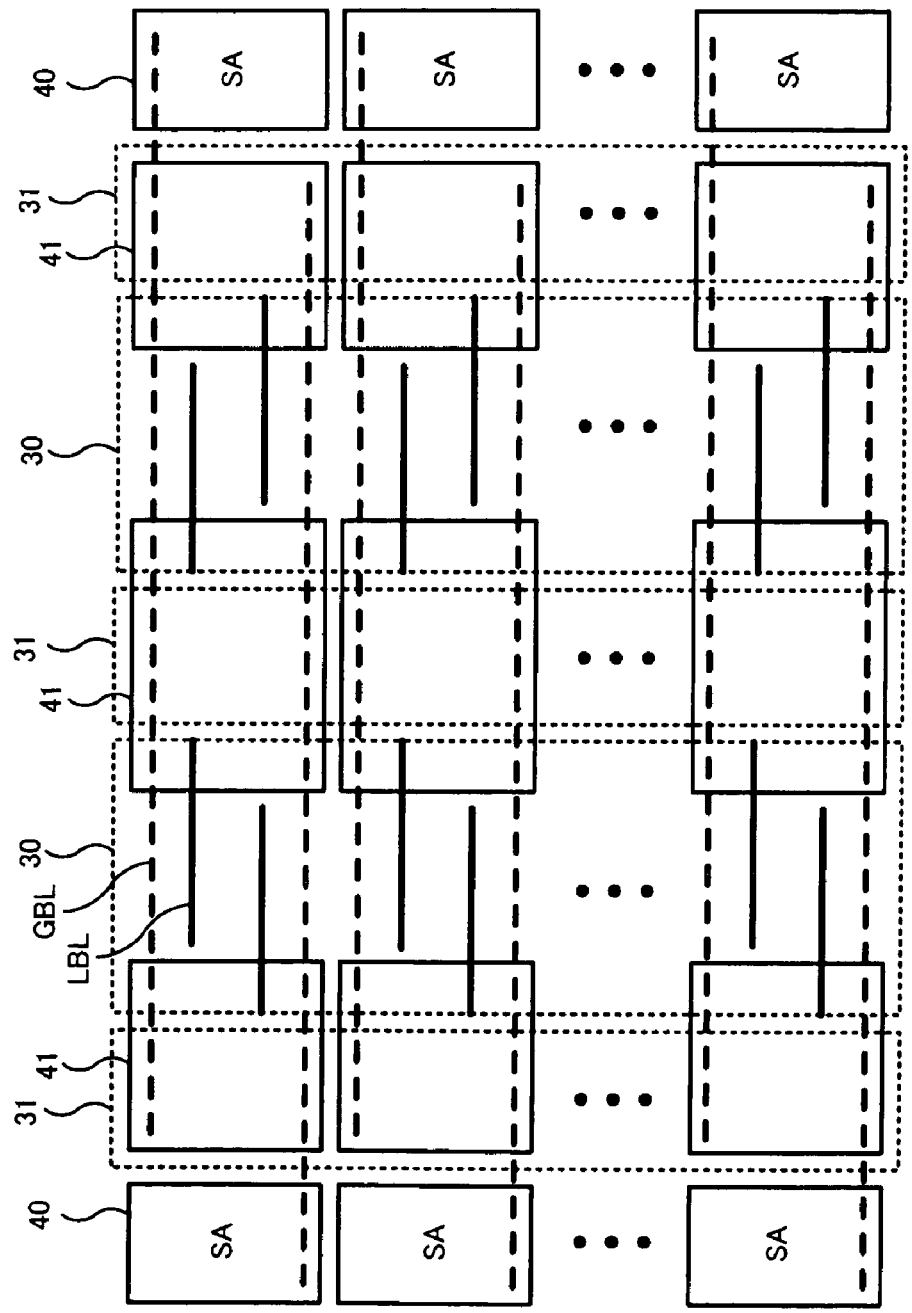
FIG. 13 a diagram showing an entire configuration of DRAM of a second embodiment.

An entire configuration of DRAM of the second embodiment will be described with reference to FIG. 13. In FIG. 13, an inside area of a DRAM chip is partitioned into memory cell array regions 30 and peripheral circuit regions 31 in the same manner as in FIG. 2. The memory cell array of FIG. 1 is configured in each memory cell array region 30. In contrast, the local sense amplifiers 20 and 21 shown in FIG. 2 are not arranged in the memory cell array region 30 and the peripheral circuit region 31. In FIG. 13, a plurality of sense amplifiers (SA) 40 to each of which the global bit line GBL is connected are arranged at the same positions of the global sense amplifiers 22 of FIG. 2. Although the local bit line LBL and the global bit line GBL are arranged in the same manner as in FIG. 2, connection circuits 41 for selectively connecting the both lines are arranged at end regions of the memory cell array regions 30 via the peripheral circuit regions 31. Thus, in the second embodiment, the amplification of each sense amplifier 40 is made through the local bit line LBL, the connection circuit 41 and the global bit line GBL without hierarchical sense amplifiers.

Figure 14:
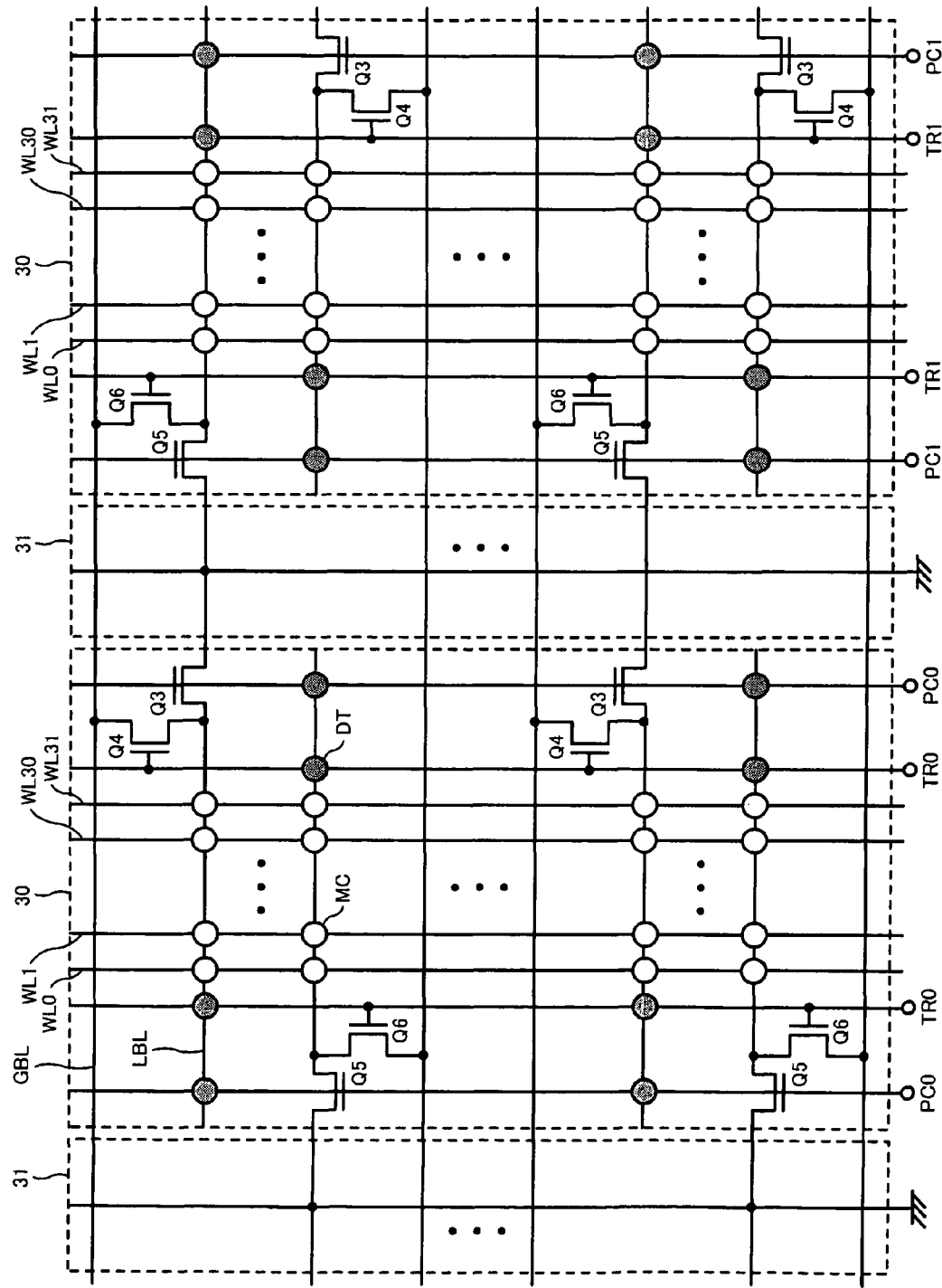
FIG. 14 is a diagram showing a specific circuit configuration of a memory cell array region and a peripheral circuit region in FIG. 13.

Next, a specific circuit configuration and operation of the memory cell array regions 30 and the peripheral circuit regions 31 in FIG. 13 will be described with reference to FIG. 14. FIG. 14 shows a circuit configuration corresponding to unit circuits included in the same range as in FIG. 3. Each connection circuit 41 at the center includes MOS transistors Q3 and Q4 provided in an end region of the left side memory cell array region 30, and MOS transistors Q5 and Q6 provided in an end region of the right side memory cell array region 30. Connections of these MOS transistors Q3 to Q6 are the same as those of the MOS transistors Q3 to Q6 shown in FIG. 3, and the vertical MOS transistors are formed with the same arrangement and the same shape as the select transistor Q0 of the memory cell MC. Dummy transistors DT in the memory cell array region 30 are the same as in FIG. 3.

Meanwhile, in FIG. 14, the left side MOS transistor Q3 and the right side MOS transistor Q5 are directly connected in the peripheral circuit region 31, as different from FIG. 3, and a connection node therebetween is connected to ground. In a precharge operation, precharge signals PC0 and PC1 are controlled to be high, and the local bit lines LBL are precharged to a ground level via the MOS transistors Q3 and Q5. Further, by controlling the selection signal TR0 or TR1 to be high in a state in which the MOS transistor Q3 or Q5 is in an OFF state, any of the local bit lines LBL can be selectively connected to the global bit line GBL via the MOS transistor Q4 or Q6.

In FIG. 14, each of the left side connection circuits 41 (FIG. 13) includes MOS transistors Q5 and Q6, and each of the right side connection circuits 41 includes MOS transistors Q3 and Q4. In this manner, a pair of MOS transistors Q5 and Q6 (Q3 and Q4) connected to one of adjacent memory cell array regions 30 are only attached to each of the connection circuits 41 on both sides.

Next, a layout of DRAM of the second embodiment will be described with reference to FIGS. 15 to 22. In the following, layout patterns will be shown in the order of process from the lower layer side within an area corresponding to FIGS. 4 to 11 of the first embodiment.

Figure 15:
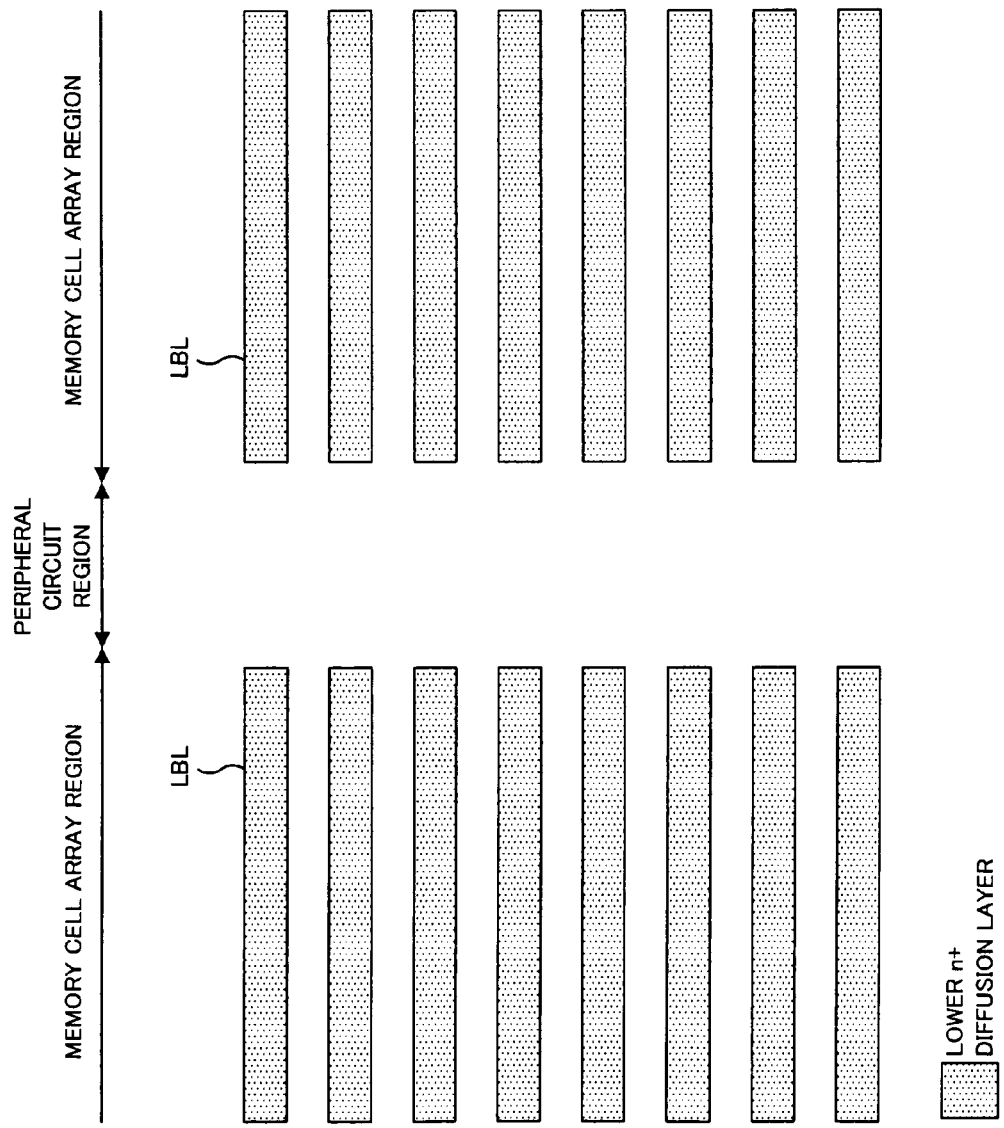
FIG. 15 is a diagram showing a layout pattern of a lower n+ diffusion layer in a layout of DRAM of the second embodiment.

FIG. 15 shows a layout pattern of a lower n+ diffusion layer formed using n-type impurity below the vertical select transistor Q0. In each of the memory cell array regions 30 on both sides, the plurality of local bit lines LBL is formed with the same pattern as in FIG. 4. Meanwhile, the lower n+ diffusion layer is not formed in the peripheral circuit region 31 at the center, since the MOS transistors are not required to be formed therein.

Figure 16:
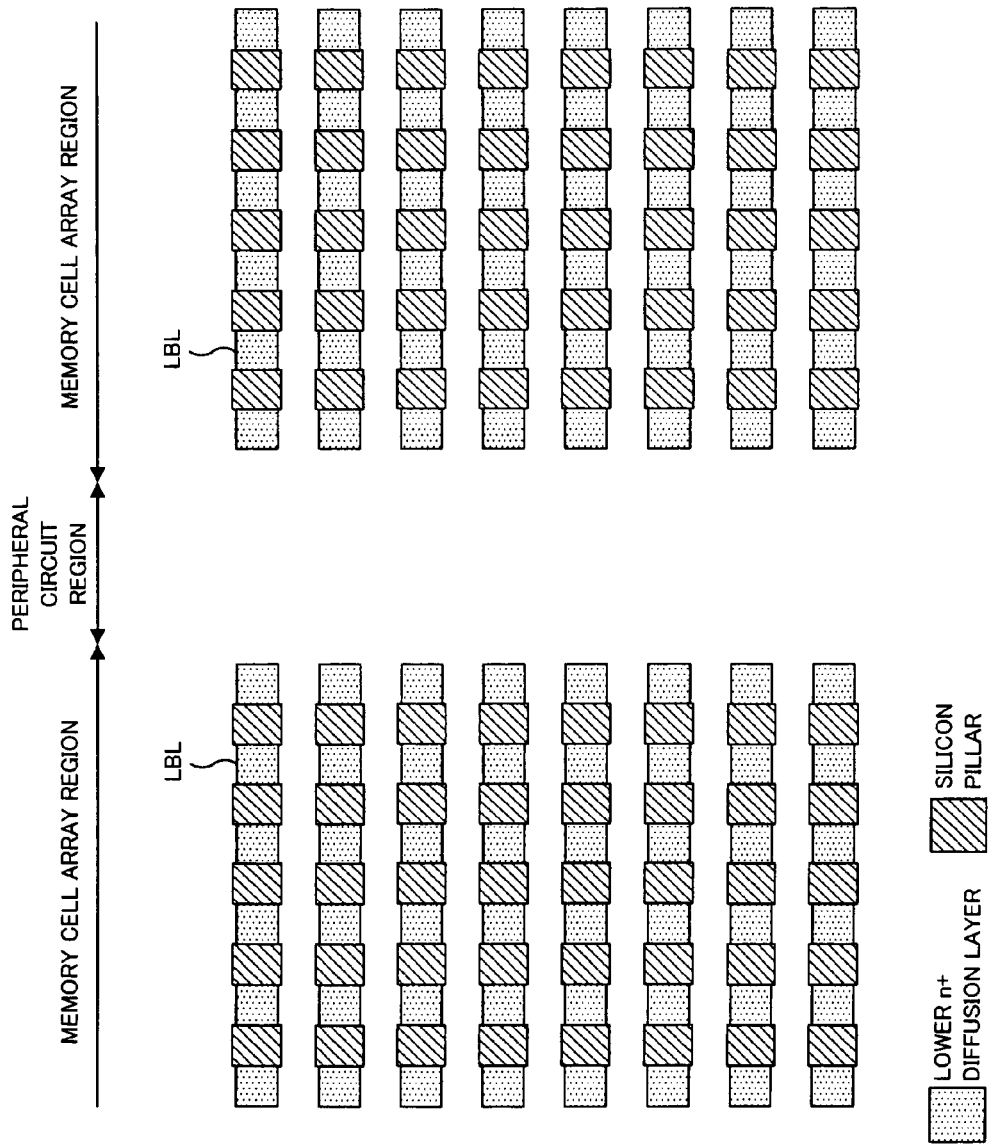
FIG. 16 is a diagram showing a layout pattern in which many silicon pillars are formed above the lower n+ diffusion layer in the layout of DRAM of the second embodiment.

FIG. 16 shows a layout pattern in which many silicon pillars are formed above the lower n+ diffusion layer of FIG. 15. In the memory cell array regions 30 on both sides, a plurality of silicon pillars is formed with the same pattern as in FIG. 5. These silicon pillars are arranged corresponding to the memory cells MC, the MOS transistors Q3 to Q6 and the dummy transistors DT of FIG. 14. Meanwhile, no silicon pillar is formed in the peripheral circuit region 31 at the center.

Figure 17:
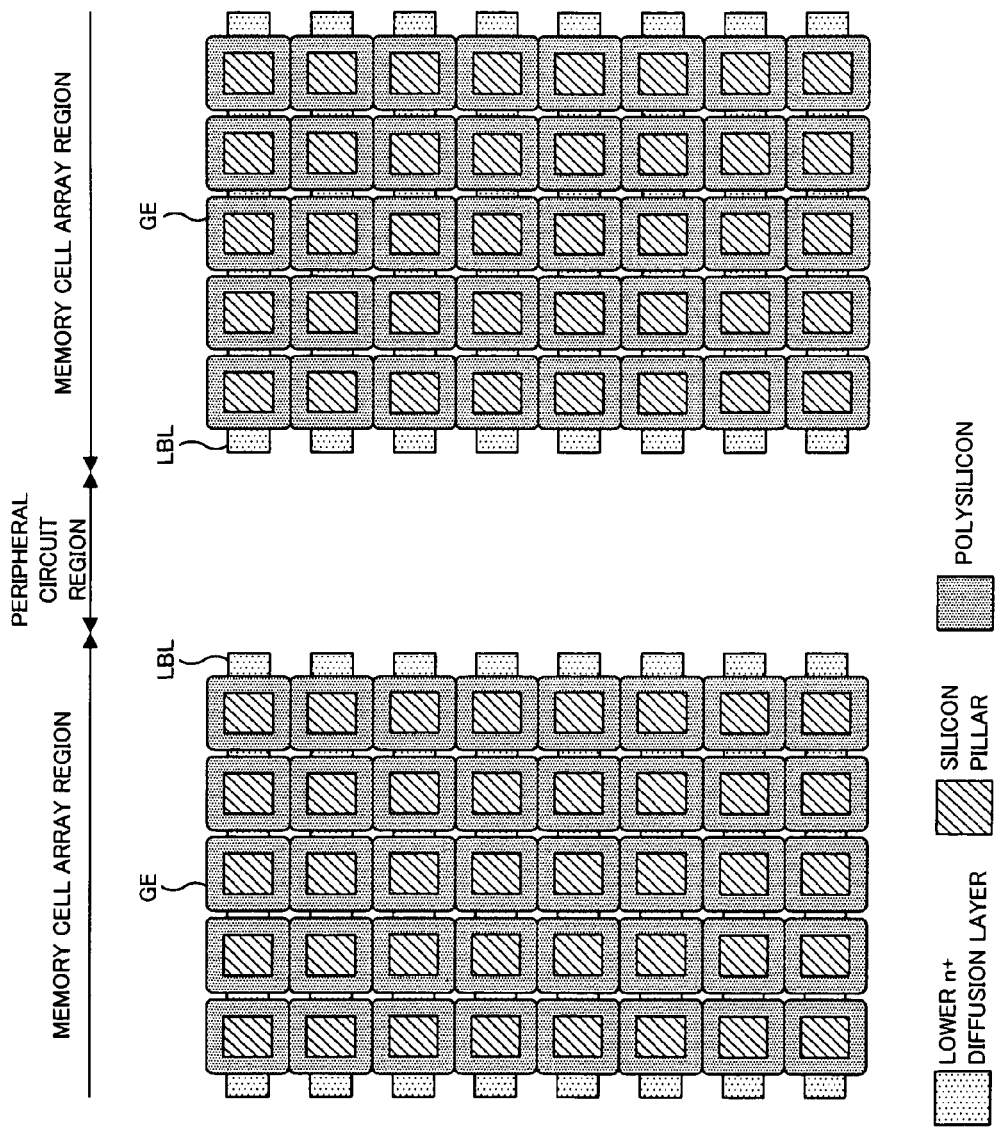
FIG. 17 is a diagram showing a layout pattern in which polysilicon is formed around each silicon pillar in the layout of DRAM of the second embodiment.

FIG. 17 shows a layout pattern in which polysilicon is formed around each silicon pillar of FIG. 16. The polysilicon is formed with the same pattern as in FIG. 6 and used as the gate electrodes GE of the vertical MOS transistors. There are arranged a wiring of the precharge signal PC0 or PC1, a wiring of the selection signals TR0 or TR1, the word lines WL31, WL30 and WL29 (or WL0, WL1 and WL2) in this order from a row near the peripheral circuit region 31 at the center. On the other hand, polysilicon is not formed in the peripheral circuit region 31 at the center.

Figure 18:
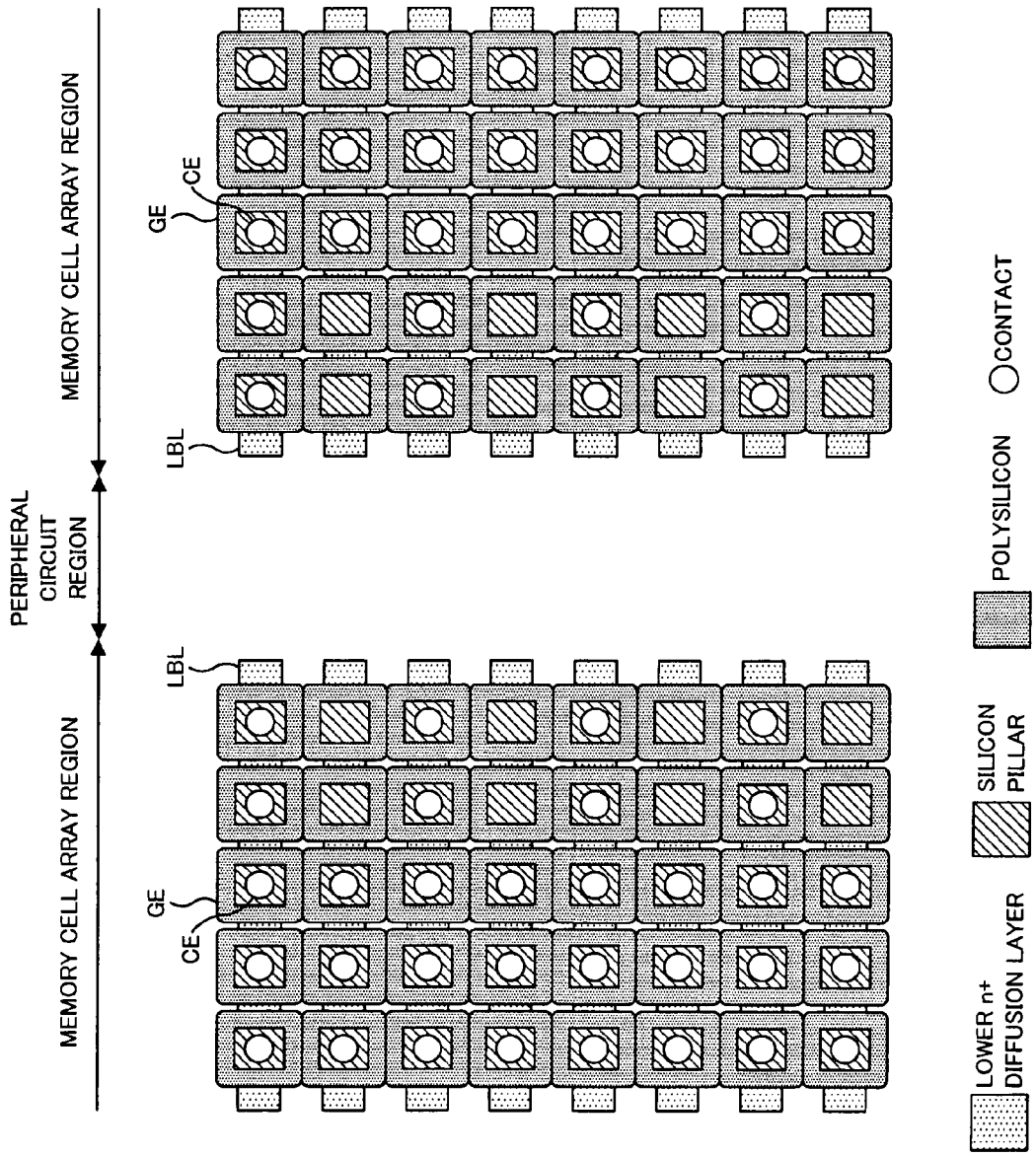
FIG. 18 is a diagram showing layout pattern in which contacts are formed over respective vertical MOS transistors in the layout of DRAM of the second embodiment.

FIG. 18 shows a layout pattern in which contacts are formed over the respective vertical MOS transistors. In the memory cell array regions 30 on both sides, the contacts are formed at the same positions as in FIG. 7, and are used as the contact electrodes CE. On the other hand, no contact is formed in the peripheral circuit region 31 at the center.

Figure 19:
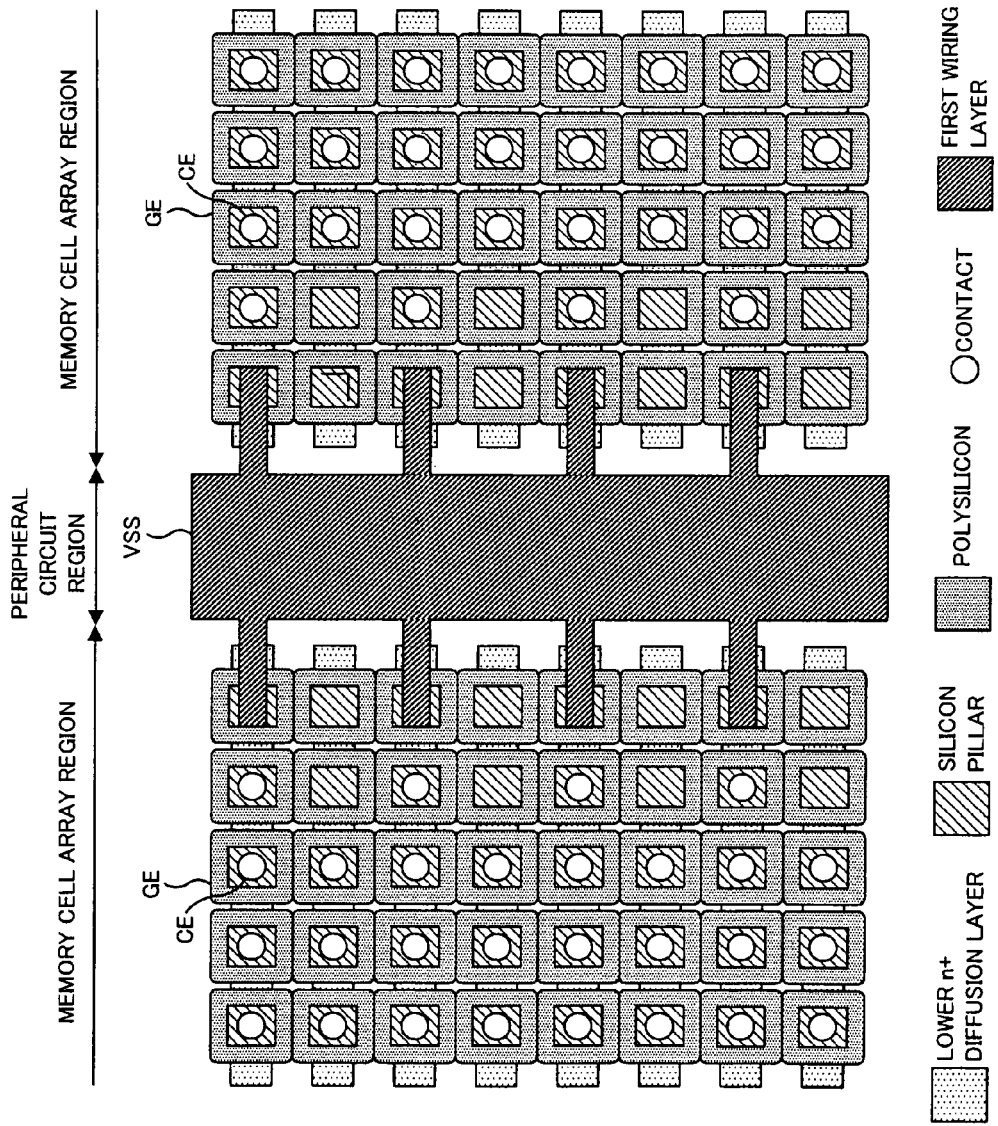
FIG. 19 is a diagram showing layout pattern in which a first wiring layer is formed above the pattern of FIG. 18 in the layout of DRAM of the second embodiment.

FIG. 19 shows a layout pattern in which a first wiring layer is formed above the pattern of FIG. 18. In the first wiring layer, there is formed a wiring of the ground potential VSS arranged entirely in the peripheral circuit region 31 at the center, and this wiring branches off so as to be connected to upper portions of the contact electrodes CE of the MOS transistors Q3 and Q5 in the memory cell array regions 30 on both sides.

Figure 20:
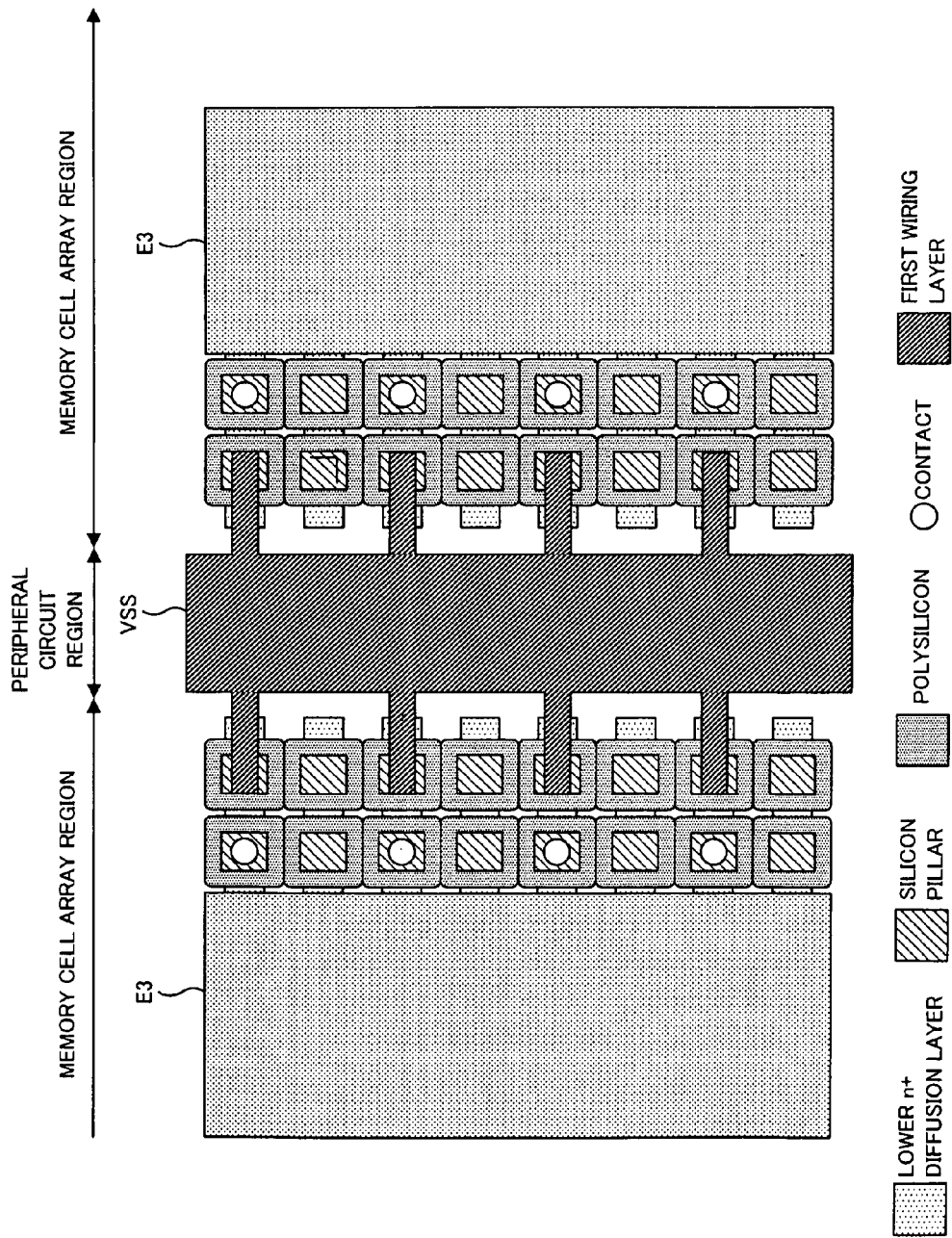
FIG. 20 is a diagram showing layout pattern in which common electrodes E3 of capacitors C0 formed above memory cells MC via a dielectric film in the layout of DRAM of the second embodiment.

FIG. 20 shows a layout pattern in which common electrodes E3 of the capacitors C0 with the same arrangement as in FIG. 9 above the memory cells MC in the memory cell array region 30.

Figure 21:
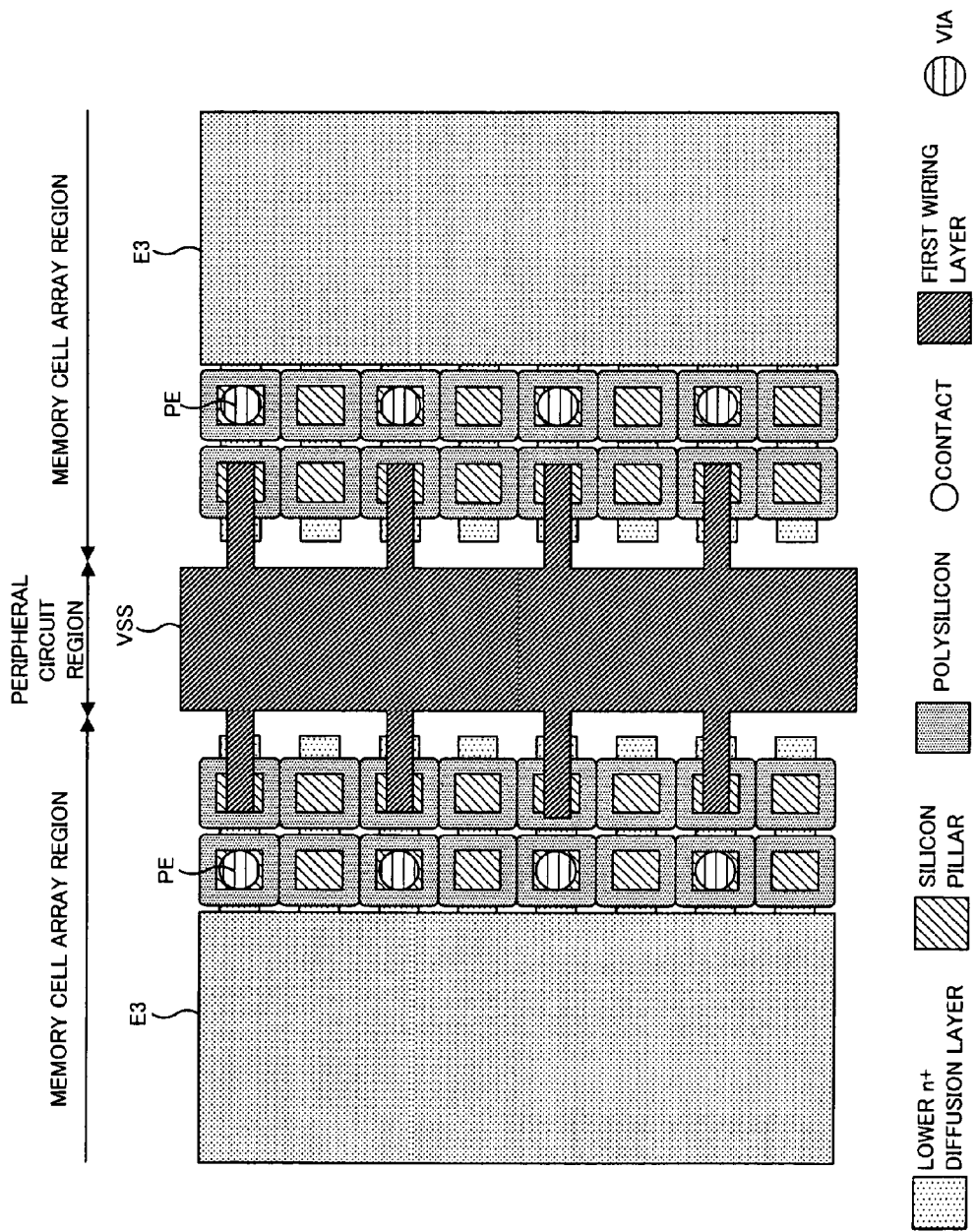
FIG. 21 is a diagram showing layout pattern in which vias are formed over contact electrodes CE in the layout of DRAM of the second embodiment.

FIG. 21 shows a layout pattern in which vias are formed over the contact electrodes CE. The vias are only formed at positions of the MOS transistors Q4, Q6 of the memory cell array regions 30 on both sides and are not formed in the peripheral circuit region 31 at the center. Plug electrodes PE are embedded in the respective vias, and each source of the MOS transistors Q4, Q6 are connected to the plug electrode PE through the contact electrode CE.

Figure 22:
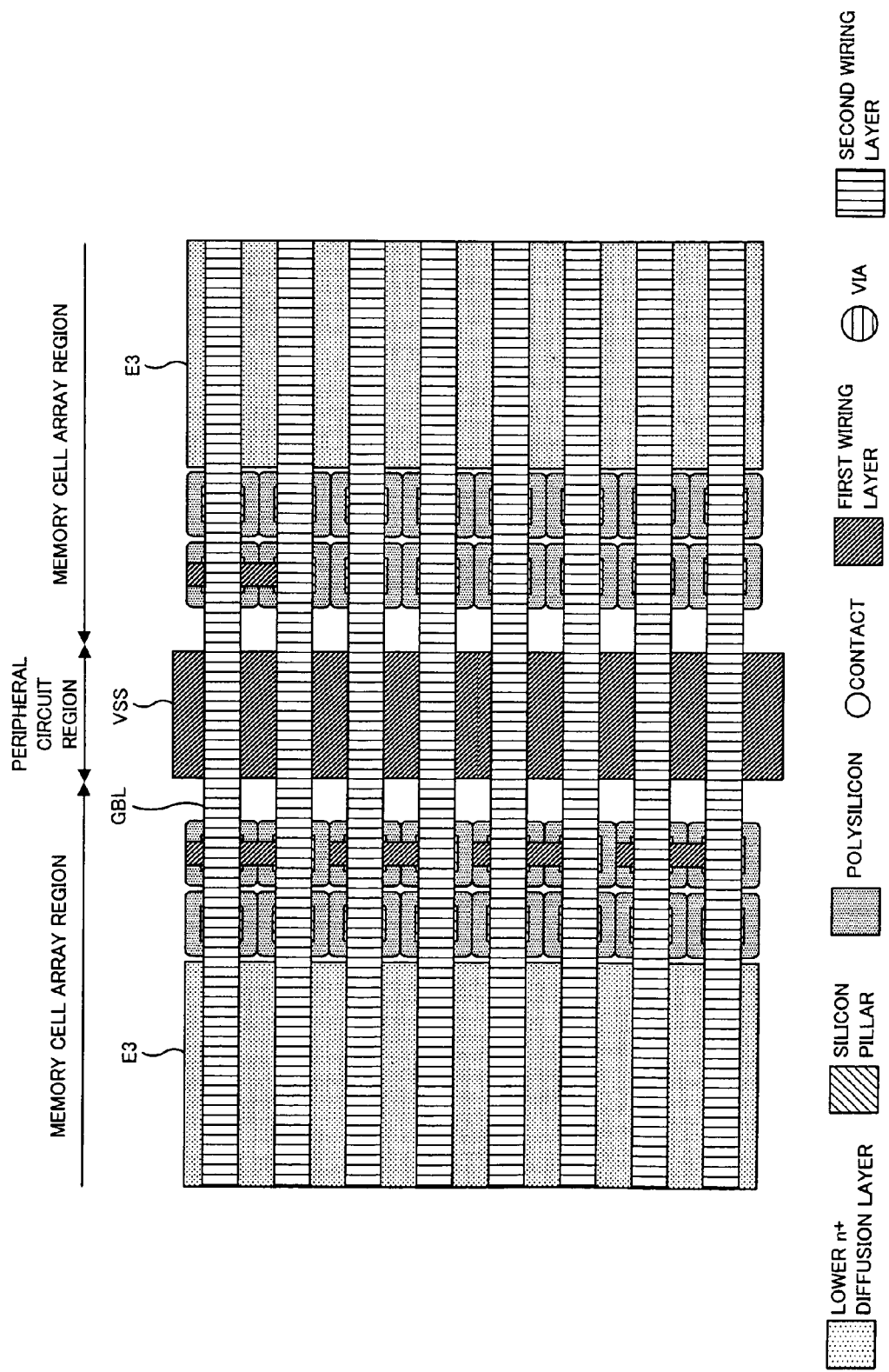
FIG. 22 is a diagram showing layout pattern in which a second wiring layer is formed above the vias of FIG. 21 in the layout of DRAM of the second embodiment.

FIG. 22 shows a layout pattern in which a second wiring layer is formed above the vias of FIG. 21. In the second wiring layer, a plurality of the global bit lines GBL is formed with the same pattern as in FIG. 11, and each global bit line GBL is connected to an upper portion of each plug electrode PE.

As described above, by employing the layout shown in FIGS. 15 to 22, the MOS transistors Q3 to Q6 of the connection circuit 41 can be arranged in the end region of the memory cell array region 30, while only the wiring of the ground potential VSS can be arranged in the peripheral circuit region 31. According to the second embodiment, the size of the MOS transistors Q3 to Q6 can be sufficiently small as in the first embodiment, and thus the entire chip area and the manufacturing cost can be reduced. In this case, since a hierarchical sense amplifier circuit is not configured, the chip area can be further reduced in comparison with the first embodiment.

Note that the modification shown in FIGS. 12A and 12B in the first embodiment can be also employed in the second embodiment. Thus, it is possible to achieve the above-mentioned effect for the PRAM as the nonvolatile semiconductor device.

It is apparent that the present invention is not limited to the above embodiments, but may be modified and changed without departing from the scope and spirit of the invention.

For example, the present invention can be widely applied to a configuration having a predetermined circuit capable of being formed using MOS transistors, which is arranged overlapping the peripheral circuit region 11 (31) and the memory cell array region 10 (30), as well as the local sense amplifiers 20 and 21 or the connection circuits 41.

What is claimed is:

1. A semiconductor memory device having a plurality of memory cells arranged at intersections of a plurality of word lines and a plurality of bit lines intersecting therewith, comprising:
   a memory cell array region in which a plurality of vertical transistors each having a lower electrode connected to each bit line is regularly arranged with a predetermined pitch, said memory cell array region including the plurality of memory cells formed using at least the vertical transistors;
   a peripheral circuit region arranged adjacent to said memory cell array region in a bit line extending direction; and
   a predetermined circuit arranged overlapping said peripheral circuit region and said memory cell array region;
   wherein one or more of the vertical transistors each having an upper electrode connected to said predetermined circuit are included in an end region of said memory cell array region, in which no word line is provided.

2. The semiconductor memory device according to claim 1, wherein one or more of the vertical transistors each having an upper electrode connected to a transistor in said peripheral circuit region are included in the end region.

3. The semiconductor memory device according to claim 1, wherein one or more of the vertical transistors each having an upper electrode connected to a wiring extending in said peripheral circuit region are included in the end region.

4. The semiconductor memory device according to claim 1, wherein each of the vertical transistors as the memory cell has an upper electrode connected to an accumulation electrode of a capacitor capable of storing information in accordance with a charge amount, and has a gate electrode connected to each word line.

5. The semiconductor memory device according to claim 1, wherein each of the vertical transistors as the memory cell has an upper electrode connected to one end of a variable resistor element capable of storing information in accordance with a resistance state, and has a gate electrode connected to each word line.

6. The semiconductor memory device according to claim 1, wherein said predetermined circuit includes a sense amplifier circuit for amplifying a signal read out from the memory cell through the bit line.

7. The semiconductor memory device according to claim 6, wherein each of the bit line is a local bit line corresponding to a hierarchical structure, and the sense amplifier circuit is a local sense amplifier circuit for amplifying a signal read out through the local bit line,
   and a plurality of global bit lines intersecting with the plurality of word lines and a global sense amplifier circuit for amplifying a signal transmitted from the local sense amplifier circuit through the global bit line are further provided.

8. The semiconductor memory device according to claim 6, wherein each of the bit line is a local bit line corresponding to a hierarchical structure,
   a plurality of global bit lines intersecting with the plurality of word lines and a sense amplifier circuit for amplifying a signal transmitted from the memory cell through the local bit line and the global bit line are further provided,
   and said predetermined circuit includes a connection circuit for selectively connecting the local bit line and the global bit line.

9. The semiconductor memory device according to claim 1, wherein said predetermined circuit includes a precharge circuit for precharging the bit line to a predetermined voltage.

10. The semiconductor memory device according to claim 1, wherein one or more of the vertical transistors which is not included in said predetermined circuit are arranged each as a dummy transistor in the end region.

* * * * *